US011075160B2

(12) United States Patent
Park et al.

(10) Patent No.: US 11,075,160 B2
(45) Date of Patent: Jul. 27, 2021

(54) SEMICONDUCTOR DEVICE AND METHOD FOR FABRICATING THEREOF

(71) Applicant: Samsung Electronics Co., Ltd., Suwon-si (KR)

(72) Inventors: Doo-Hwan Park, Yongin-si (KR); Seong Ho Park, Suwon-si (KR); Kyoung Pil Park, Yongin-si (KR); Tae Yong Bae, Seoul (KR); Eun-Chul Seo, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/385,188

(22) Filed: Apr. 16, 2019

(65) Prior Publication Data
US 2020/0013715 A1 Jan. 9, 2020

(30) Foreign Application Priority Data

Jul. 3, 2018 (KR) .......................... 10-2018-0077024

(51) Int. Cl.
*H01L 23/522* (2006.01)
*H01L 23/528* (2006.01)
*H01L 21/768* (2006.01)

(52) U.S. Cl.
CPC .... *H01L 23/5226* (2013.01); *H01L 21/76816* (2013.01); *H01L 21/76829* (2013.01); *H01L 21/76843* (2013.01); *H01L 21/76877* (2013.01); *H01L 23/5283* (2013.01)

(58) Field of Classification Search
CPC ......................... H01L 23/5226; H01L 23/5283
See application file for complete search history.

(56) References Cited

U.S. PATENT DOCUMENTS

| 7,602,028 | B2 | 10/2009 | Son et al. | |
|---|---|---|---|---|
| 7,687,316 | B2 | 3/2010 | Jung | |
| 7,880,123 | B2 | 2/2011 | Kim et al. | |
| 7,960,797 | B2 | 6/2011 | Lee et al. | |
| 8,736,058 | B2 | 5/2014 | Kwon et al. | |
| 9,082,820 | B2 | 7/2015 | Shimotsusa | |
| 9,318,696 | B2 | 4/2016 | Lu et al. | |
| 10,020,255 | B1* | 7/2018 | Bao | H01L 21/76879 |
| 2004/0238964 | A1* | 12/2004 | Kawano | H01L 21/76804 257/758 |
| 2005/0151224 | A1* | 7/2005 | Abe | H01L 21/32135 257/510 |
| 2007/0048931 | A1* | 3/2007 | Shimizu | H01L 21/76855 438/243 |
| 2013/0292817 | A1* | 11/2013 | LaCroix | H01L 23/5329 257/737 |

(Continued)

*Primary Examiner* — Moazzam Hossain
(74) *Attorney, Agent, or Firm* — Harness, Dickey & Pierce, P.L.C.

(57) ABSTRACT

A semiconductor device is provided. The semiconductor device includes a first wiring and a second wiring disposed at a first metal level, a third wiring and a fourth wiring disposed at a second metal level different from the first metal level, a first via which directly connects the first wiring and the third wiring, a fifth wiring disposed at a third metal level between the first metal level and the second metal level and connected to the second wiring, and a second via which directly connects the fourth wiring and the fifth wiring.

19 Claims, 20 Drawing Sheets

(56) References Cited

U.S. PATENT DOCUMENTS

| | | | |
|---|---|---|---|
| 2016/0027687 A1* | 1/2016 | Greco | H01L 21/76811 |
| | | | 438/666 |
| 2016/0027726 A1* | 1/2016 | Zhu | H01L 23/5283 |
| | | | 257/751 |
| 2016/0133512 A1* | 5/2016 | Lee | H01L 21/32134 |
| | | | 438/666 |
| 2019/0122982 A1* | 4/2019 | Hourani | H01L 21/76831 |
| 2019/0304929 A1* | 10/2019 | Yang | H01L 23/528 |

* cited by examiner

SEMICONDUCTOR DEVICE AND METHOD FOR FABRICATING THEREOF

CROSS-REFERENCE TO RELATED APPLICATION

This application claims priority to Korean Patent Application No. 10-2018-0077024, filed on Jul. 3, 2018, and all the benefits accruing therefrom under 35 U.S.C. § 119, the disclosure of which is incorporated herein by reference in its entirety.

BACKGROUND

1. Technical Field

The present disclosure relates to a semiconductor device and a method for fabricating thereof.

2. Description of the Related Art

In recent years, as down-scaling of semiconductor elements has rapidly progressed due to development of electronic techniques, higher integration and/or lower power consumption of semiconductor chips are required. In order to cope with the requirements for higher integration and/or lower power consumption of the semiconductor chips, feature sizes of semiconductor elements are continuously decreasing.

On the other hand, with a decrease in feature size, various researches are being conducted on a method for stably forming a wiring and a via hole for connecting the wiring.

SUMMARY

Aspects of the present disclosure provide a semiconductor device which improves routability of a wiring process and/or improves the performance and reliability of the element, using a via for connecting the wirings located at metal levels with a difference of at least two metal levels or more.

Aspects of the present disclosure provide a method for fabricating the semiconductor device which improves routability of a wiring process and/or improves the performance and reliability of the element, using a via for connecting the wiring located at metal levels with a difference of at least two metal levels or more.

According to an example embodiment of the present disclosure, there is provided a semiconductor device, comprising a first wiring and a second wiring at a first metal level, a third wiring and a fourth wiring at a second metal level different from the first metal level, a first via which directly connects the first wiring and the third wiring, a fifth wiring at a third metal level between the first metal level and the second metal level and connected to the second wiring, and a second via which directly connects the fourth wiring and the fifth wiring.

According to an example embodiment of the present disclosure, there is provided a semiconductor device, comprising a first wiring and a second wiring at a first metal level, a third wiring and a fourth wiring at a second metal level higher than the first metal level, a first interlayer insulating layer between the first metal level and the second metal level, a second interlayer insulating layer on the first interlayer insulating layer, a first filling layer which connects the first wiring and the third wiring, and extends over the first interlayer insulating layer and the second interlayer insulating layer, a second filling layer in the first interlayer insulating layer and connected to the second wiring, and a third filling layer in the second interlayer insulating layer and connected to the fourth wiring and the second filling layer.

According to an example embodiment of the present disclosure, there is provided a semiconductor device, comprising a first wiring and a second wiring, a first interlayer insulating layer on the first wiring and the second wiring, a third wiring in the first interlayer insulating layer, an etching prevention layer including an opening on the third wiring, a second interlayer insulating layer on the etching prevention layer, a fourth wiring and a fifth wiring in the second interlayer insulating layer, a first trench which exposes a part of the first wiring in the first interlayer insulating layer, a second trench which exposes a part of the third wiring in the second interlayer insulating layer, a third trench which penetrates the opening and exposes a part of the second wiring, in the first interlayer insulating layer and the second interlayer insulating layer, a first via which connects the first wiring and the third wiring in the first trench, a second via which connects the third wiring and the fourth wiring in the second trench, and a third via which connects the second wiring and the fifth wiring in the third trench.

According to an example embodiment of the present disclosure, there is provided a method for fabricating a semiconductor device, comprising forming a first interlayer insulating layer on a first wiring and a second wiring, forming a first via and a third wiring connected to the first wiring, in the first interlayer insulating layer, forming an etching prevention layer on the third wiring and the first interlayer insulating layer, the etching prevention layer including an opening through which a part of the first interlayer insulating layer is exposed, forming a second interlayer insulating layer on the etching prevention layer, forming a first trench for exposing a part of the third wiring and a second trench for exposing a part of the second wiring in the second interlayer insulating layer, the second trench penetrating the opening, and forming a fourth wiring for filling the first trench and a fifth wiring for filling the second trench.

The aspects of the present disclosure are not restricted to those mentioned above and another aspect which is not mentioned may be clearly understood by those skilled in the art from the description below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF EMBODIMENTS

Hereinafter, connection between wirings formed in a BEOL (Back-end-of-line) process performed after a FEOL (Front-end-of-line) process for forming a gate electrode or the like of a transistor will be described, but embodiments are not limited thereto. The wiring located at the lowest level may be a conductive pattern formed in the FEOL process.

Figure 1:
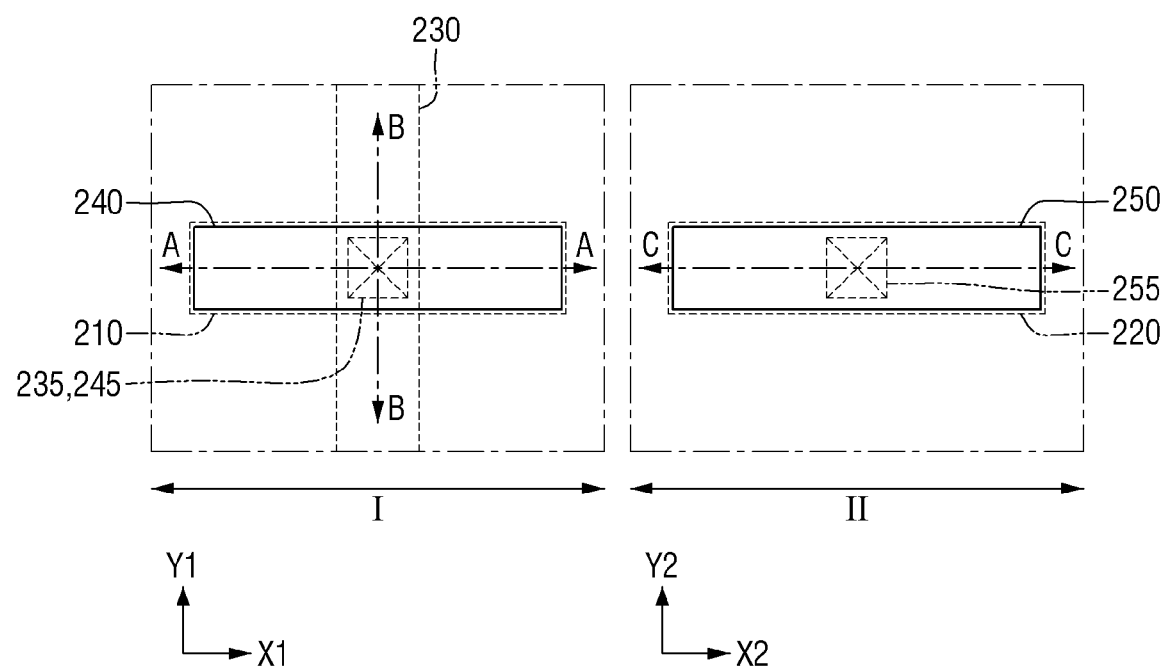
FIG. 1 is a plan view for explaining a semiconductor device according to some embodiments of the present disclosure.
Figure 2:
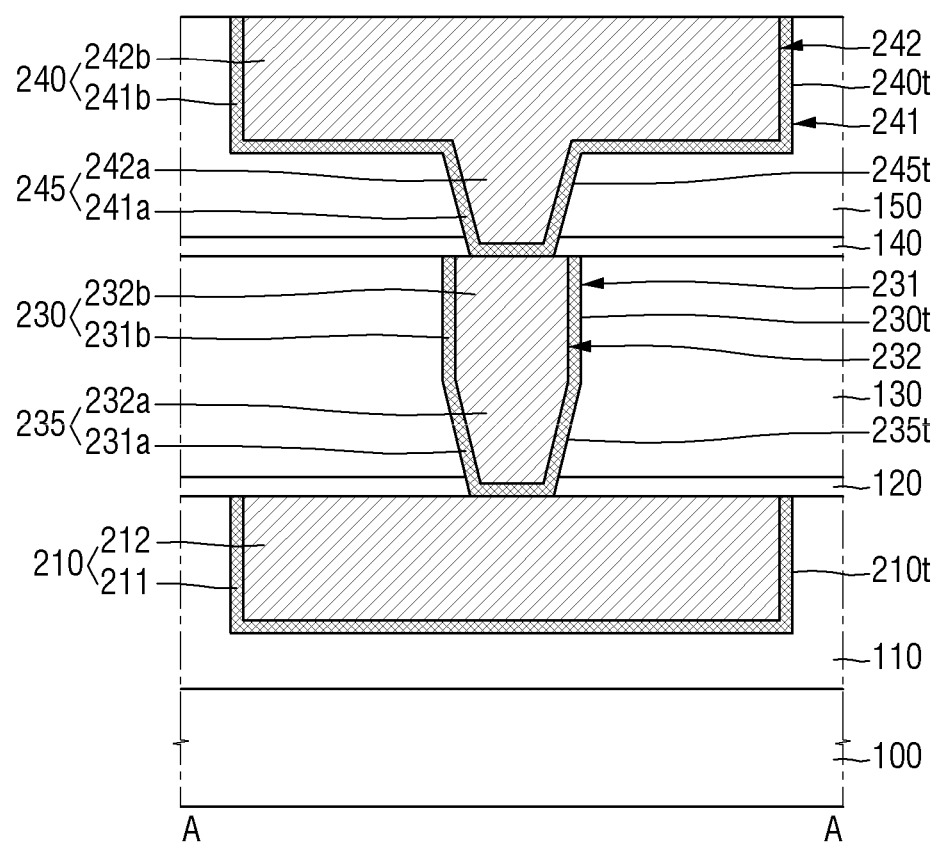
FIG. 2 is a cross-sectional view taken along line A-A of FIG. 1.
Figure 3:
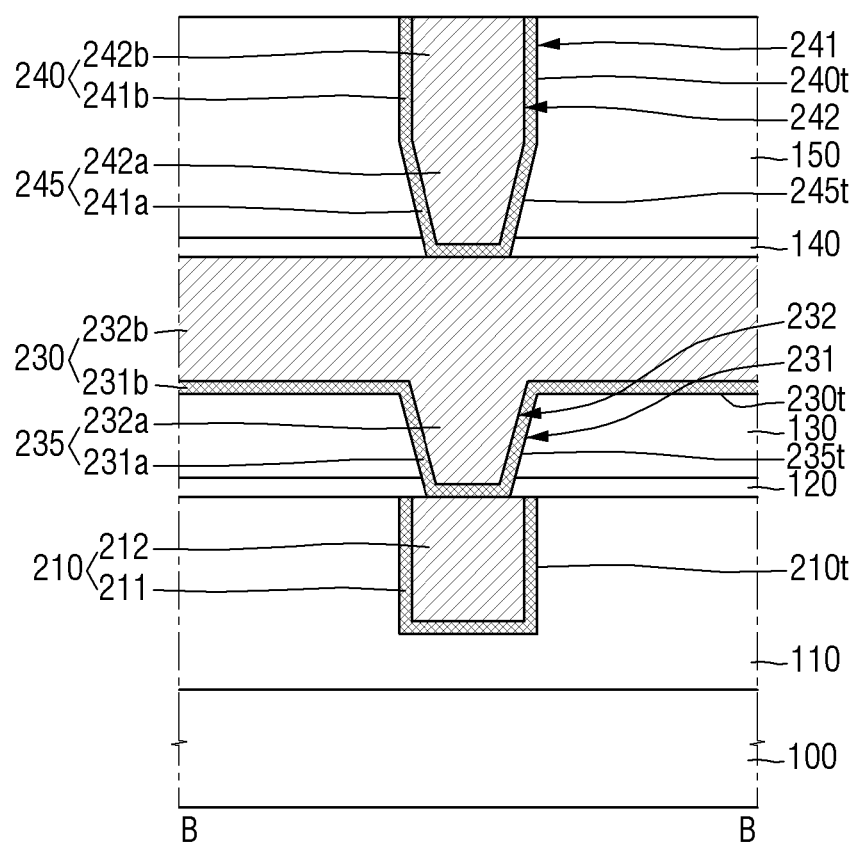
FIG. 3 is a cross-sectional view taken along line B-B of FIG. 1.
Figure 4:
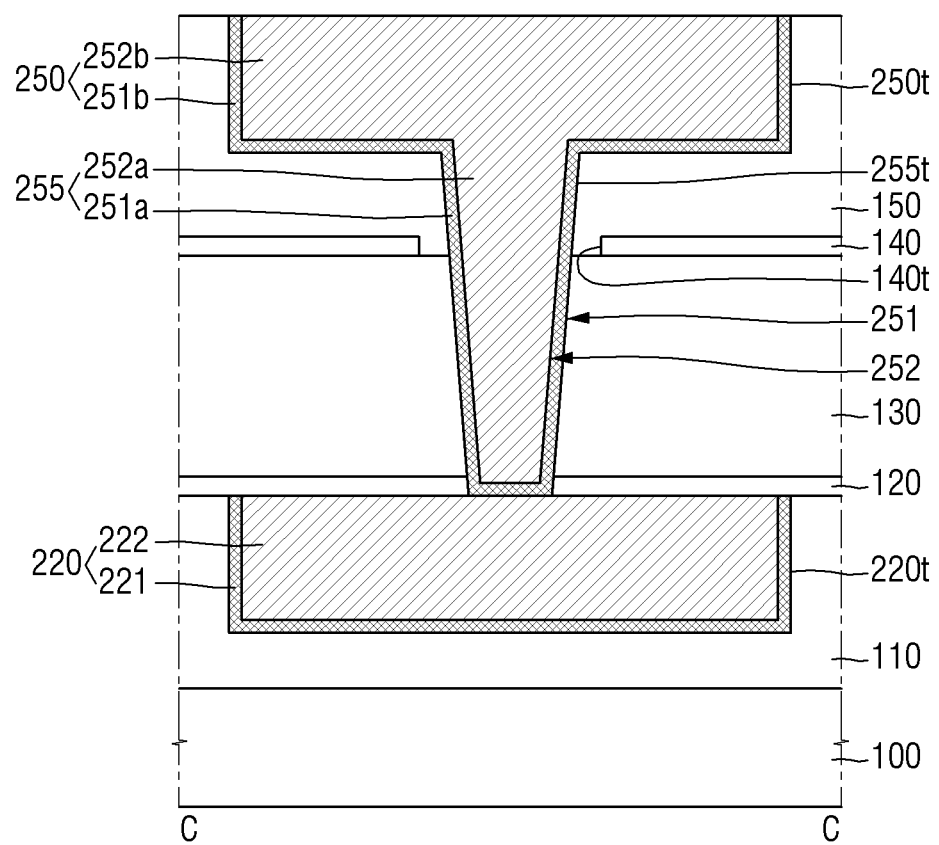
FIG. 4 is a cross-sectional view taken along line C-C of FIG. 1.

FIG. 1 is a plan view for explaining the semiconductor device according to some embodiments of the present disclosure. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1.

For reference, FIG. 1 is an example plan view illustrated for explaining the present disclosure, but is not limited thereto.

Referring to FIG. 1 to FIG. 4, the semiconductor device according to some embodiments of the present disclosure may include a first lower wiring 210, a second lower wiring 220, a first wiring 230, a second wiring 240, a third wiring 250, a first via 235, a second via 245 and/or a third via 255.

The first lower wiring 210 and the second lower wiring 220 may be formed on the substrate 100. The first lower wiring 210 may be formed on a first region I of the substrate 100. The second lower wiring 220 may be formed on a second region II of the substrate 100. The first region I of the substrate 100 and the second region II of the substrate 100 may be regions connected to each other or may be regions separated from each other.

The first lower wiring 210 may extend in a first direction X1. The second lower wiring 220 may extend in a second direction X2. The first direction X1 may be a direction parallel to the second direction X2 or may be a direction intersecting the second direction X2.

The substrate 100 may have a structure in which a base substrate and an epitaxial layer are laminated, but the present disclosure is not limited thereto. The substrate 100 may be a silicon substrate, a gallium arsenide substrate, a silicon germanium substrate, a ceramic substrate, a quartz substrate, a display glass substrate, or the like, and may be an SOI (semiconductor on insulator) substrate.

Also, although it is not illustrated, the substrate 100 may include a conductive pattern. The conductive pattern may be a metal wiring, a contact, a conductive pad or the like, and may be a gate electrode of the transistor, a source/drain of the transistor, or a diode, but embodiments are not restricted thereto.

Additionally, although it is not illustrated, each of the first lower wiring 210 and the second lower wiring 220 may be electrically connected to the conductive pattern included in the substrate 100.

The first lower wiring 210 and the second lower wiring 220 may be disposed at a first metal level. The first lower wiring 210 and the second lower wiring 220 may be disposed in the first interlayer insulating layer 110 on the substrate 100. The first interlayer insulating layer 110 may include a first lower wiring trench 210t and/or a second lower wiring trench 220t.

The first lower wiring 210 may be formed in the first lower wiring trench 210t. The second lower wiring 220 may be formed in the second lower wiring trench 220t.

The first lower wiring 210 may include a first lower barrier layer 211 and/or a first lower filling layer 212. The first lower barrier layer 211 may extend along sidewalls and a bottom surface of the first lower wiring trench 210t. The first lower filling layer 212 may be formed on the first lower barrier layer 211.

The second lower wiring 220 may include a second lower barrier layer 221 and/or a second lower filling layer 222. The second lower barrier layer 221 may extend along the sidewall and the bottom surface of the second lower wiring trench 220t. The second lower filling layer 222 may be formed on the second lower barrier layer 221.

Although it is not illustrated, each of the first lower wiring 210 and the second lower wiring 220 may include a capping conductive layer formed along the upper surface of the first lower wiring 210 and the upper surface of the second lower wiring 220.

Each of the first lower barrier layer 211 and the second lower filling layer 222 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir) and rhodium (Rh).

Each of the first lower filling layer 212 and the second lower filling layer 222 may include, for example, at least one of aluminum (Al), copper (Cu), tungsten (W), and cobalt (Co).

When each of the first lower filling layer 212 and the second lower filling layer 222 contains copper, copper contained in each of the first lower filling layer 212 and the second lower filling layer 222, may include, for example, at least one of carbon (C), silver (Ag), cobalt (Co), tantalum (Ta), indium (In), tin (Sn), zinc (Zn), manganese (Mn), titanium (Ti), magnesium (Mg), chrome (Cr), germanium (Ge), strontium (Sr), platinum (Pt), magnesium (Mg), aluminum (Al) or zirconium (Zr).

The first interlayer insulating layer 110 may include, for example, at least one of silicon oxide, silicon nitride, silicon oxynitride and a low-k material.

For example, the first interlayer insulating layer 110 may include a low-k material in order to reduce a coupling phenomenon between the wirings. The low-k material may be, for example, a silicon oxide with suitably high carbon and hydrogen and may be a material such as SiCOH.

On the other hand, since carbon is contained in the insulating material, the dielectric constant of the insulating material may be lowered. However, in order to further reduce the dielectric constant of the insulating material, the insulating material may contain pores such as cavity in which gas or air is filled in the insulating material.

The low-k material may include, but is not limited to, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO, (Carbon Doped Silicon Oxide), OSG (Organo Silicate Glass) SiLK, Amorphous Fluorinated Carbon, silica aerogels, silica xerogels, mesoporous silica or combinations thereof.

The first wiring 230 may be formed on the first lower wiring 210. The first wiring 230 may extend in the third direction Y1. In FIG. 1, the first wiring 230 is illustrated as intersecting with the first lower wiring 210, but the present disclosure is not limited thereto. The first wiring 230 may extend in the same first direction X1 as the first lower wiring 210.

The first wiring 230 may be disposed at a second metal level different from the first metal level. The first wiring 230 may be disposed at a second metal level higher than the first metal level. The first wiring 230 disposed at the second metal level may be connected to the first lower wiring 210 disposed at the first metal level.

The first via 235 may directly connect the first wiring 230 and the first lower wiring 210. The first wiring 230 may be electrically connected to the first lower wiring 210 through the first via 235.

The first wiring 230 and the first via 235 may be disposed in the second interlayer insulating layer 130 on the first interlayer insulating layer 110. The second interlayer insulating layer 130 may be formed on the first lower wiring 210 and the second lower wiring 220. A first etching prevention layer 120 may be formed between the second interlayer insulating layer 130 and the first interlayer insulating layer 110.

The second interlayer insulating layer 130 may include a first wiring trench 230t and/or a first via trench 235t. The first wiring trench 230t may extend long in the third direction Y1. The first via trench 235t may be formed on the bottom surface of the first wiring trench 230t. The first via trench 235t may expose a part of the first lower wiring 210.

The first wiring trench 230t may extend long in the third direction Y1. The expression "extending long in the third direction Y1" means that the width of the first wiring trench 230t in the third direction Y1 is greater than the width of the first wiring trench 230t in the first direction X1

The first wiring 230 may be disposed in the first wiring trench 230t. The first via 235 may be disposed in the first via trench 235t. As illustrated, the first wiring 230 and the first via 235 may be an integral structure. In other words, the first wiring 230 and the first via 235 may be formed by the same manufacturing process. Alternatively, each of the first filling layer 232 and the first barrier layer 231 may be an integral structure.

The first wiring 230 and the first via 235 may include a first barrier layer 231 and/or a first filling layer 232. At least a part of the first barrier layer 231 and at least a part of the first filling layer 232 may be disposed in the second interlayer insulating layer 130.

The first barrier layer 231 may extend along the sidewall and the bottom surface of the first wiring trench 230t and the sidewall and the bottom surface of the first via trench 235t. The first filling layer 232 may be formed on the first barrier layer 231. The first filling layer 232 may fill the first wiring trench 230t and the first via trench 235t.

The first barrier layer 231 may include a first portion 231a and a second portion 231b. The first portion 231a of the first barrier layer may extend along the sidewall and the bottom surface of the first via trench 235t. The second portion 231b of the first barrier layer may extend along the sidewall and the bottom surface of the first wiring trench 230t.

The first filling layer 232 may include a first portion 232a and a second portion 232b. The first portion 232a of the first filling layer may fill the first via trench 235t. The second portion 232b of the first filling layer may fill the first wiring trench 230t.

The first wiring 230 may include the second portion 231b of the first barrier layer and the second portion 232b of the first filling layer. The first via 235 may include the first portion 231a of the first barrier layer and the first portion 232a of the first filling layer. The first portion 232a of the first filling layer may connect the first lower wiring 210 and the first wiring 230. The first portion 232a of the first filling layer may connect the first lower wiring 210 and the second portion 232b of the first filling layer.

The second interlayer insulating layer 130 may include, for example, at least one of silicon oxide, silicon nitride, silicon oxynitride and a low-k material. The first etching prevention layer 120 may include a material having an etching selection ratio with respect to the second interlayer insulating layer 130.

The first etching prevention layer 120 may include, for example, at least one of silicon nitride (SiN), silicon oxynitride (SiON), and silicon carbonitride (SiCN).

The second wiring 240 may be formed on the first wiring 230. The second wiring 240 may extend in the first direction X1. In FIG. 1, the second wiring 240 is illustrated as intersecting with the first wiring 230, but embodiments are not limited thereto. The second wiring 240 may extend in the same third direction Y1 as the first wiring 230.

The third wiring 250 may be formed on the second lower wiring 220. The third wiring 250 may extend in the second direction X2. In FIG. 1, the third wiring 250 is illustrated as extending in the same direction as the second lower wiring 220, but embodiments are not limited thereto. The third wiring 250 may extend in the fourth direction Y2 intersecting the second direction X2.

The second wiring 240 and the third wiring 250 may be disposed at a third metal level different from the second metal level. The second metal level may be located between the first metal level and the third metal level. The second wiring 240 and the third wiring 250 may be disposed at the third metal level higher than the second metal level.

The second wiring 240 disposed at the third metal level may be connected to the first wiring 230 disposed at the second metal level. The third wiring 250 disposed at the third metal level may be connected to the second lower wiring 220 disposed at the first metal level.

The second via 245 may directly connect the second wiring 240 and the first wiring 230. The second wiring 240 may be electrically connected to the first wiring 230 through the second via 245. The second wiring 240 may be electrically connected to the first lower wiring 210 through the second via 245, the first wiring 230 and the first via 235.

The third via 255 may directly connect the third wiring 250 and the second lower wiring 220. The third via 255 may directly connect the third wiring 250 and the second lower wiring 220 without passing through the wiring disposed at the second metal level. The third wiring 250 may be electrically connected to the second lower wiring 220 through the third via 255.

The second wiring 240, the third wiring 250 and the second via 245 may be disposed in the third interlayer insulating layer 150 on the second interlayer insulating layer 130. The third via 255 may be disposed in the second interlayer insulating layer 130 and the third interlayer insulating layer 150. The third via 255 may extend over the second interlayer insulating layer 130 and the third interlayer insulating layer 150.

The third interlayer insulating layer 150 may be formed on the first wiring 230. A second etching prevention layer 140 may be formed between the third interlayer insulating layer 150 and the second interlayer insulating layer 130.

The second etching prevention layer 140 may be disposed between the third metal level and the first metal level. The second etching prevention layer 140 may include a first opening 140*t*. The third via 255 may penetrate and pass through the first opening 140*t*. In the semiconductor device according to some embodiments of the present disclosure, the third via 255 is not in contact with the second etching prevention layer 140.

The third interlayer insulating layer 150 may include a second wiring trench 240*t* and/or a second via trench 245*t*. The second wiring trench 240*t* may extend long in the first direction X1. The second via trench 245*t* may be formed on the bottom surface of the second wiring trench 240*t*. The second via trench 245*t* may expose a part of the first wiring 230.

Furthermore, the third interlayer insulating layer 150 may include a third wiring trench 250*t* and/or a third via trench 255*t*. The third via trench 255*t* may also be formed in the second interlayer insulating layer 130. In other words, the second interlayer insulating layer 130 and the third interlayer insulating layer 150 may include the third via trench 255*t*.

The third wiring trench 250*t* may extend long in the third direction Y1. The third via trench 255*t* may be formed on the bottom surface of the third wiring trench 250*t*. The third via trench 255*t* may expose a part of the second lower wiring 220. The third via trench 255*t* may be formed in the second interlayer insulating layer 130 and/or the third interlayer insulating layer 150 through the first opening 140*t*.

The second wiring 240 may be disposed in the second wiring trench 240*t*. The second via 245 may be disposed in the second via trench 245*t*. The second wiring 240 and the second via 245 may be an integral structure. The third wiring 250 may be disposed in the third wiring trench 250*t*. The third via 255 may be disposed in the third via trench 255*t*. The third wiring 250 and the third via 255 may be an integral structure.

The second wiring 240 and the second via 245 may include a second barrier layer 241 and a second filling layer 242. At least a part of the second barrier layer 241 and at least a part of the second filling layer 242 may be disposed in the third interlayer insulating layer 150.

The second barrier layer 241 may extend along the sidewall and the bottom surface of the second wiring trench 240*t* and the sidewall and the bottom surface of the second via trench 245*t*. The second filling layer 242 may be formed on the second barrier layer 241. The second filling layer 242 may fill the second wiring trench 240*t* and the second via trench 245*t*.

The second barrier layer 241 may include a first portion 241*a* and/or a second portion 241*b*. The first portion 241*a* of the second barrier layer may extend along the sidewall and the bottom surface of the second via trench 245*t*. The second portion 241*b* of the second barrier layer may extend along the sidewall and the bottom surface of the second wiring trench 240*t*.

The second filling layer 242 may include a first portion 242*a* and a second portion 242*b*. The first portion 242*a* of the second filling layer may fill the second via trench 245*t*. The second portion 242*b* of the second filling layer may fill the second wiring trench 240*t*.

The second wiring 240 may include the second portion 241*b* of the second barrier layer and the second portion 242*b* of the second filling layer. The second via 245 may include the first portion 241*a* of the second barrier layer, and the first portion 242*a* of the second filling layer. The first portion 242*a* of the second filling layer may connect the first wiring 230 and the second wiring 240. The first portion 242*a* of the second filling layer may connect the first filling layer 232, and the second portion 242*b* of the second filling layer.

The second filling layer 242 may be spaced apart from the first filling layer 232. The second barrier layer 241 may be disposed between the second filling layer 242 and the first filling layer 232. In other words, the first portion 242*a* of the second filling layer and the second portion 232*b* of the first filling layer may be spaced apart from each other, by the first portion 241*a* of the second barrier layer extending between the first portion 242*a* of the second filling layer and the third interlayer insulating layer 150, and between the first portion 242*a* of the second filling layer and the second portion 232*b* of the first filling layer.

The third wiring 250 and the third via 255 may include a third barrier layer 251 and a third filling layer 252. At least a part of the third barrier layer 251 and at least a part of the third filling layer 252 may be disposed in the second interlayer insulating layer 130 and the third interlayer insulating layer 150.

The third barrier layer 251 may extend along the sidewall and bottom surface of the third wiring trench 250*t* and the sidewall and bottom surface of the third via trench 255*t*. The third filling layer 252 may be formed on the third barrier layer 251. The third filling layer 252 may fill the third wiring trench 250*t* and the third via trench 255*t*.

The third barrier layer 251 may include a first portion 251*a* and/or a second portion 251*b*. The first portion 251*a* of the third barrier layer may extend along the sidewall and the bottom surface of the third via trench 255*t*. The second portion 251*b* of the third barrier layer may extend along the sidewall and the bottom surface of the third wiring trench 250*t*.

The first portion 251*a* of the third barrier layer may be formed over the second interlayer insulating layer 130 and the third interlayer insulating layer 150. The second portion 251*b* of the third barrier layer may be formed in the third interlayer insulating layer 150.

The third filling layer 252 may include a first portion 252*a* and a second portion 252*b*. The first portion 252*a* of the third filling layer may fill the third via trench 255*t*. The second portion 252*b* of the third filling layer may fill the third wiring trench 250*t*.

The first portion 252*a* of the third filling layer may extend over the second interlayer insulating layer 130 and the third interlayer insulating layer 150. The first portion 252*a* of the third filling layer may penetrate and pass through the first opening 140*t*. The second portion 252*b* of the third filling layer may be formed in the third interlayer insulating layer 150.

The third wiring 250 may include the second portion 251*b* of the third barrier layer and the second portion 252*b* of the third filling layer. The third via 255 may include the first portion 251a of the third barrier layer and the first portion 252a of the third filling layer. The first portion 252a of the third filling layer may connect the second lower wiring 220 and the third wiring 250. The first portion 252a of the third filling layer may connect the second lower filling layer 222 and the second portion 252b of the third filling layer.

Each of the first to third barrier layer 231, 241 and 251 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), and rhodium (Rh).

Each of the first to third filling layers 232, 242 and 252 may include, for example, at least one of aluminum (Al), copper (Cu), tungsten (W) and cobalt (Co).

The third interlayer insulating layer 150 may include, for example, at least one of silicon oxide, silicon nitride, silicon oxynitride and a low-k material. The second etching prevention layer 140 may include a material having an etching selection ratio with respect to the third interlayer insulating layer 150. The second etching prevention layer 140 may include, for example, at least one of silicon nitride (SiN), silicon oxynitride (SiON), and silicon carbonitride (SiCN).

It may be desired to directly connect the second lower wiring 220 of the first metal level and the third wiring 250 of the third metal level.

First, when utilizing the wiring intended for the connection disposed at the second metal level between the first metal level and the third metal level, IR drop may occur. However, by directly connecting the second lower wiring 220 and the second wiring 240 using the third via 255, IR drop may be reduced or prevented.

Next, the wiring intended for the connection disposed at the second metal level is also included in the layout of all the wirings disposed at the second metal level. A space for forming the wiring intended for the connection needs to be assigned to the second metal level. That is, by disposing the wiring intended for connection, an unnecessary space due to the wiring intended for connection may be generated at the second metal level.

However, by directly connecting the second lower wiring 220 and the second wiring 240 using the third via 255, the space for the wiring intended for connection does not need to be assigned within the second metal level. Therefore, the routability of the wirings included in the second metal level of the semiconductor device may be improved.

In FIG. 1, the first lower wiring 210 is illustrated to have a width greater in the first direction X1 and the third direction Y1 than that of the second wiring 240, but this is only for convenience of explanation, and embodiments are not limited thereto. Further, although the second lower wiring 220 is illustrated to have a width greater in the second direction X2 and the fourth direction Y2 than that of the third wiring 250, this is only for convenience of explanation, and embodiments are not limited thereto.

Although it is illustrated in FIG. 2 to FIG. 4 that other wirings of the BEOL process are not disposed below the first lower wiring 210 and the second lower wiring 220, the present disclosure is not limited thereto. Further, although it is illustrated that other wirings of the BEOL process are not disposed on the second wiring 240 and the third wiring 250, the present disclosure is not limited thereto.

Figure 5:
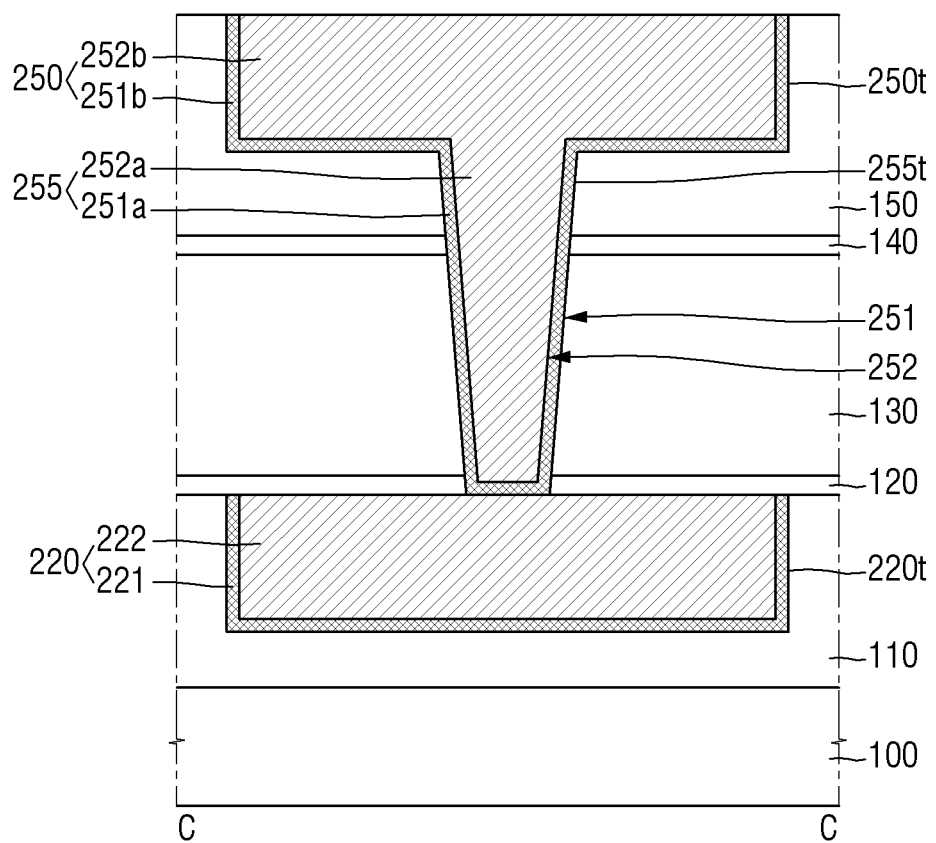
FIG. 5 is a diagram for explaining a semiconductor device for some embodiments of the present disclosure.

FIG. 5 is a diagram for explaining the semiconductor device for some embodiments of the present disclosure. For the sake of convenience of explanation, differences from those described with reference to FIG. 1 to FIG. 4 will be mainly described.

Referring to FIG. 5, in the semiconductor device according to some embodiments of the present disclosure, the third via 255 may be in contact with the second etching prevention layer 140.

A part of the sidewall of the third via trench 255t may be defined by the second etching prevention layer 140. A part of the third barrier layer 251 may be formed along the second etching prevention layer 140 exposed by the third via trench 255t. The first portion 251a of the third barrier layer may be in contact with the second etching prevention layer 140.

Figure 6:
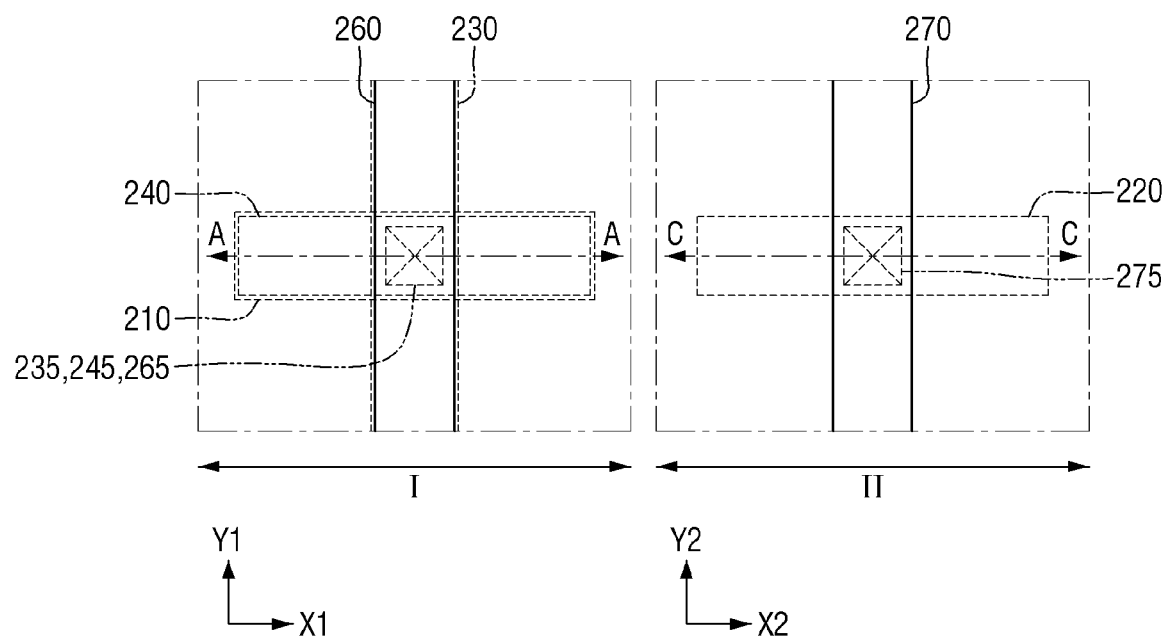
FIG. 6 is a plan view illustrating the semiconductor device according to some embodiments of the present disclosure.
Figure 7:
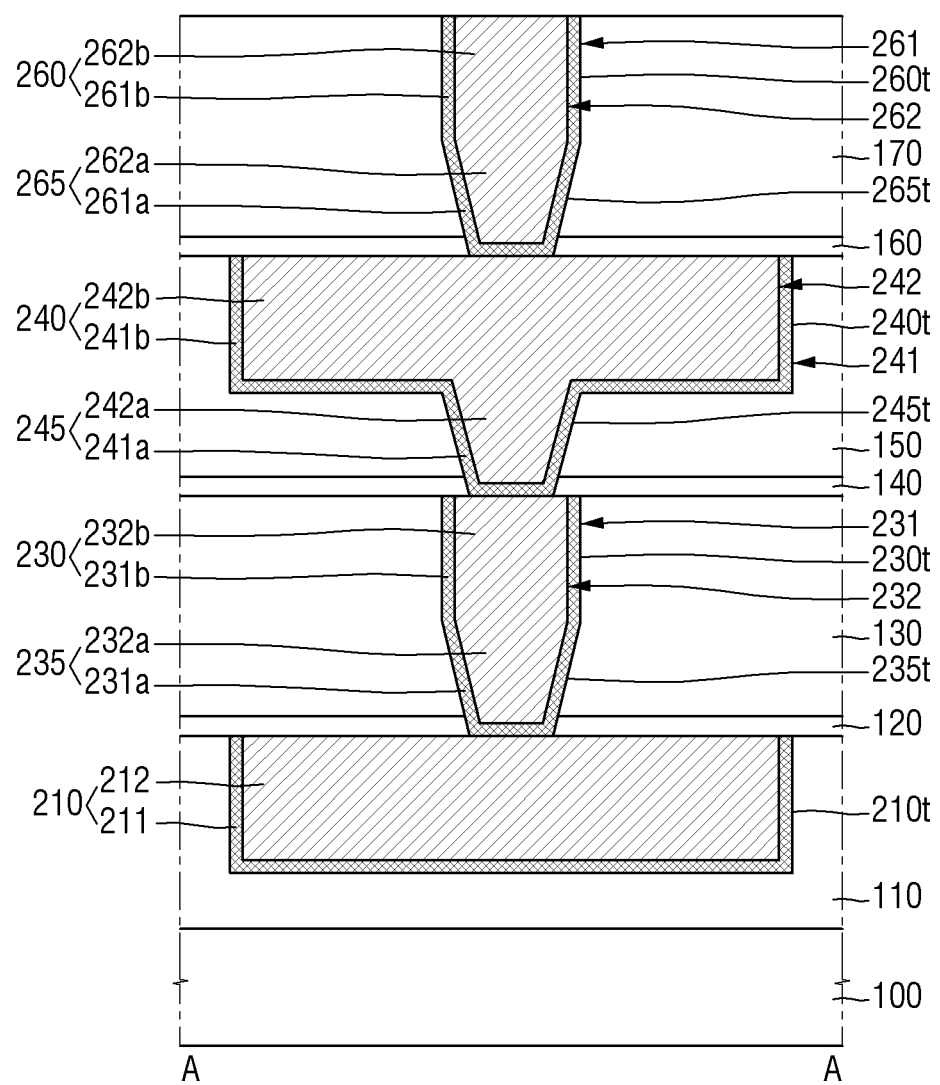
FIG. 7 is a cross-sectional view taken along line A-A of FIG. 6.
Figure 8:
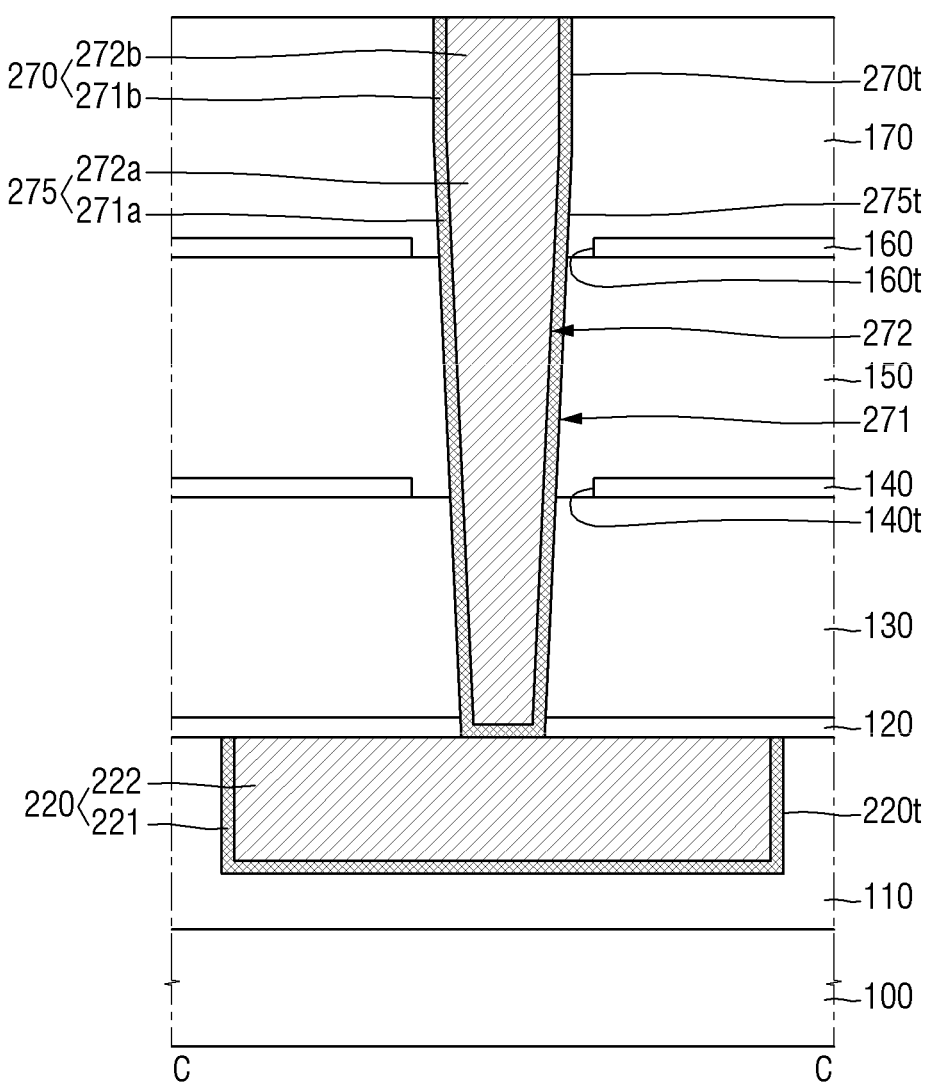
FIG. 8 is a cross-sectional view taken along line C-C of FIG. 6.

FIG. 6 is a plan view illustrating the semiconductor device according to some embodiments of the present disclosure. FIG. 7 is a cross-sectional view taken along line A-A in FIG. 6. FIG. 8 is a cross-sectional view taken along the line C-C of FIG. 6. For the sake of convenience of explanation, differences from those described with reference to FIG. 1 to FIG. 4 will be mainly described.

For reference, FIG. 6 is merely an example plan view illustrated for explaining the present disclosure, and is not limited thereto.

Referring to FIG. 6 to FIG. 8, the semiconductor device according to some embodiments of the present disclosure may include a first lower wiring 210, a second lower wiring 220, a first wiring 230, a second wiring 240, a fourth wiring 260, a fifth wiring 270, a first via 235, a second via 245, a fourth via 265 and/or a fifth via 275.

The third wiring 250 may not be disposed at the third metal level of the second region II of the board 100. Also, the third via 255 may also not be formed.

The fourth wiring 260 may be formed on the second wiring 240. The fourth wiring 260 may extend in the third direction Y1. In FIG. 6, the fourth wiring 260 is illustrated as intersecting with the second wiring 240, but embodiments are not limited thereto. The fourth wiring 260 may extend in the same first direction X1 as the second wiring 240.

The fifth wiring 270 may be formed on the second lower wiring 220. The fifth wiring 270 may extend in the fourth direction Y2. In FIG. 6, the fifth wiring 270 is illustrated as intersecting the second lower wiring 220, but embodiments are not limited thereto. The fifth wiring 270 may extend in the same second direction X2 as the second lower wiring 220.

The fourth wiring 260 and the fifth wiring 270 may be disposed at a fourth metal level different from the third metal level. The third metal level may be located between the second metal level and the fourth metal level. The fourth wiring 260 and the fifth wiring 270 may be disposed at a fourth metal level higher than the third metal level.

The fourth wiring 260 disposed at the fourth metal level may be connected to the second wiring 240 disposed at the third metal level. The fifth wiring 270 disposed at the fourth metal level may be connected to the second lower wiring 220 disposed at the first metal level.

The fourth via 265 may directly connect the fourth wiring 260 and the second wiring 240. The fourth wiring 260 may be electrically connected to the second wiring 240 through the fourth via 265. The fourth wiring 260 may be electrically connected to the first lower wiring 210 through the fourth via 265, the second wiring 240, the second via 245, the first wiring 230 and/or the first via 235.

The fifth via 275 may directly connect the fifth wiring 270 and the second lower wiring 220. The fifth via 275 may directly connect the fifth wiring 270 and the second lower wiring 220, without passing through the wirings disposed at the second metal level and the third metal level. The fifth wiring 270 may be electrically connected to the second lower wiring 220 through the fifth via 275.

The fourth wiring 260, the fifth wiring 270, and/or the fourth via 265 may be disposed in the fourth interlayer insulating layer 170 on the third interlayer insulating layer 150. The fifth via 275 may be disposed in the second interlayer insulating layer 130, the third interlayer insulating layer 150, and the fourth interlayer insulating layer 170. The fifth via 275 may extend over the second interlayer insulating layer 130, the third interlayer insulating layer 150 and the fourth interlayer insulating layer 170.

The fourth interlayer insulating layer 170 may be formed on the second wiring 240. A third etching prevention layer 160 may be formed between the fourth interlayer insulating layer 170 and the third interlayer insulating layer 150.

The third etching prevention layer 160 may be disposed between the fourth metal level and the second metal level. The third etching prevention layer 160 may include a second opening 160t. The fifth via 275 may penetrate and pass through the first opening 140t and the second opening 160t. In the semiconductor device according to some embodiments of the present disclosure, the fifth via 275 is not in contact with the second etching prevention layer 140 and the third etching prevention layer 160.

The fourth interlayer insulating layer 170 may include a fourth wiring trench 260t and a fourth via trench 265t. The fourth wiring trench 260t may extend long in the third direction Y1. The fourth via trench 265t may be formed on the bottom surface of the fourth wiring trench 260t. The fourth via trench 265t may expose a part of the second wiring 240.

Further, the fourth interlayer insulating layer 170 may include a fifth wiring trench 270t and a fifth via trench 275t. The fifth via trench 275t may also be formed in the second interlayer insulating layer 130 and the third interlayer insulating layer 150. In other words, the second interlayer insulating layer 130, the third interlayer insulating layer 150 and the fourth interlayer insulating layer 170 may include the fifth via trench 275t.

The fifth wiring trench 270t may extend long in the fourth direction Y2. The fifth via trench 275t may be formed on the bottom surface of the fifth wiring trench 270t. The fifth via trench 275t may expose a part of the second lower wiring 220. The fifth via trench 275t may be formed in the second interlayer insulating layer 130, the third interlayer insulating layer 150 and the fourth interlayer insulating layer 170 through the first opening 140t and the second opening 160t.

The fourth wiring 260 may be disposed in the fourth wiring trench 260t. The fourth via 265 may be disposed in the fourth via trench 265t. The fourth wiring 260 and the fourth via 265 may be an integral structure. The fifth wiring 270 may be disposed in the fifth wiring trench 270t. The fifth via 275 may be disposed in the fifth via trench 275t. The fifth wiring 270 and the fifth via 275 may be an integral structure.

The fourth wiring 260 and the fourth via 265 may include a fourth barrier layer 261 and a fourth filling layer 262. At least a part of the fourth barrier layer 261 and at least a part of the fourth filling layer 262 may be disposed in the fourth interlayer insulating layer 170.

The fourth barrier layer 261 may extend along the sidewall and the bottom surface of the fourth wiring trench 260t and the sidewall and the bottom surface of the fourth via trench 265t. The fourth filling layer 262 may be formed on the fourth barrier layer 261. The fourth filling layer 262 may fill the fourth wiring trench 260t and the fourth via trench 265t.

The fourth barrier layer 261 may include a first portion 261a and a second portion 261b. The first portion 261a of the fourth barrier layer may extend along the sidewall and the bottom surface of the fourth via trench 265t. The second portion 261b of the fourth barrier layer may extend along the sidewall and the bottom surface of the fourth wiring trench 260t.

The fourth filling layer 262 may include a first portion 262a and a second portion 262b. The first portion 262a of the fourth filling layer may fill the fourth via trench 265t. The second portion 262b of the fourth filling layer may fill the fourth wiring trench 260t.

The fourth wiring 260 may include the second portion 261b of the fourth barrier layer and the second portion 262b of the fourth filling layer. The fourth via 265 may include the first portion 261a of the fourth barrier layer, and the first portion 262a of the fourth filling layer. The first portion 262a of the fourth filling layer may connect the second wiring 240 and the fourth wiring 260. The first portion 262a of the fourth filling layer may connect the second filling layer 242 and the second portion 262b of the fourth filling layer.

The fourth filling layer 262 may be spaced apart from the second filling layer 242. A fourth barrier layer 261 may be disposed between the fourth filling layer 262 and the second filling layer 242. In other ways, the first portion 262a of the fourth filling layer and the second portion 242b of the second filling layer may be spaced apart from each other by the first portion 261a of the fourth barrier layer extending between the first portion 262a of the fourth filling layer and the fourth interlayer insulating layer 170, and between the first portion 262a of the fourth filling layer and the second portion 242b of the second filling layer.

The fifth wiring 270 and the fifth via 275 may include a fifth barrier layer 271 and a fifth filling layer 272. At least a part of the fifth barrier layer 271 and at least a part of the fifth filling layer 272 may be disposed inside the second interlayer insulating layer 130, the third interlayer insulating layer 150, and the fourth interlayer insulating layer 170.

The fifth barrier layer 271 may extend along the sidewall and the bottom surface of the fifth wiring trench 270t and the sidewall and the bottom surface of the fifth via trench 275t. The fifth filling layer 272 may be formed on the fifth barrier layer 271. The fifth filling layer 272 may fill the fifth wiring trench 270t and the fifth via trench 275t.

The fifth barrier layer 271 may include a first portion 271a and a second portion 271b. The first portion 271a of the fifth barrier layer may extend along the sidewall and the bottom surface of the fifth via trench 275t. The second portion 271b of the fifth barrier layer may extend along the sidewall and the bottom surface of the fifth wiring trench 270t.

The first portion 271a of the fifth barrier layer may be formed over the second interlayer insulating layer 130, the third interlayer insulating layer 150 and the fourth interlayer insulating layer 170. The second portion 271b of the fifth barrier layer may be formed in the fourth interlayer insulating layer 170.

The fifth filling layer 272 may include a first portion 272a and a second portion 272b. The first portion 272a of the fifth filling layer may fill the fifth via trench 275t. The second portion 272b of the fifth filling layer may fill the fifth wiring trench 270t.

The first portion 272a of the fifth filling layer may extend over the second interlayer insulating layer 130, the third interlayer insulating layer 150 and the fourth interlayer insulating layer 170. The first portion 272a of the fifth filling layer may penetrate and pass through the first opening 140t and the second opening 160t. The second portion 272b of the fifth filling layer may be formed in the fourth interlayer insulating layer 170.

The fifth wiring 270 may include the second portion 271b of the fifth barrier layer and the second portion 272b of the fifth filling layer. The fifth via 275 may include the first portion 271a of the fifth barrier layer, and the first portion 272a of the fifth filling layer. The first portion 272a of the fifth filling layer may connect the second lower wiring 220 and the fifth wiring 270. The first portion 272a of the fifth filling layer may connect the second lower wiring 220 and the second portion 272b of the fifth filling layer.

The fourth interlayer insulating layer 170 may include, for example, at least one of silicon oxide, silicon nitride, silicon oxynitride and a low-k material. The third etching prevention layer 160 may include a material having an etching selection ratio with respect to the fourth interlayer insulating layer 170.

The third etching prevention layer 160 may include, for example, at least one of silicon nitride (SiN), silicon oxynitride (SiON), and silicon carbonitride (SiCN).

Figure 9:
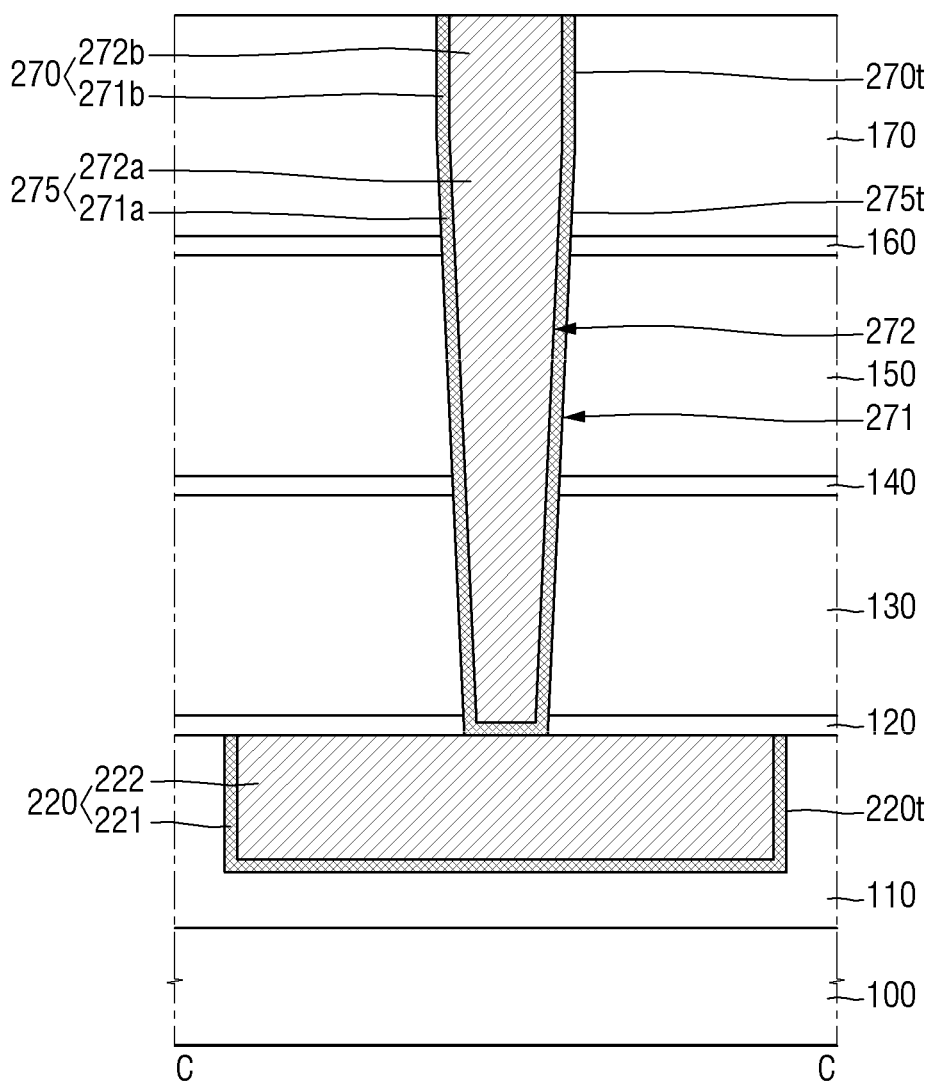
FIG. 9 is a diagram for explaining the semiconductor device for some embodiments of the present disclosure.

FIG. 9 is a diagram for explaining the semiconductor device for some embodiments of the present disclosure. For the sake of convenience of explanation, differences from those described with reference to FIG. 6 to FIG. 8 will be mainly described.

Referring to FIG. 9, in the semiconductor device according to some embodiments of the present disclosure, a fifth via 275 may be in contact with the second etching prevention layer 140 and the third etching prevention layer 160.

A part of the sidewall of the fifth via trench 275t may be defined by the second etching prevention layer 140 and the third etching prevention layer 160. A part of the fifth barrier layer 271 may be formed along the second etching prevention layer 140 and the third etching prevention layer 160 exposed by the fifth via trench 275t. The first portion 271a of the fifth barrier layer may be in contact with the second etching prevention layer 140 and the third etching prevention layer 160.

Unlike the illustrated example, the fifth via 275 may also be in contact with one of the second etching prevention layer 140 or the third etching prevention layer 160. In such a case, the etching prevention layer which is not in contact with the fifth via 275 may include an opening through which the fifth via 275 passes.

Figure 10:
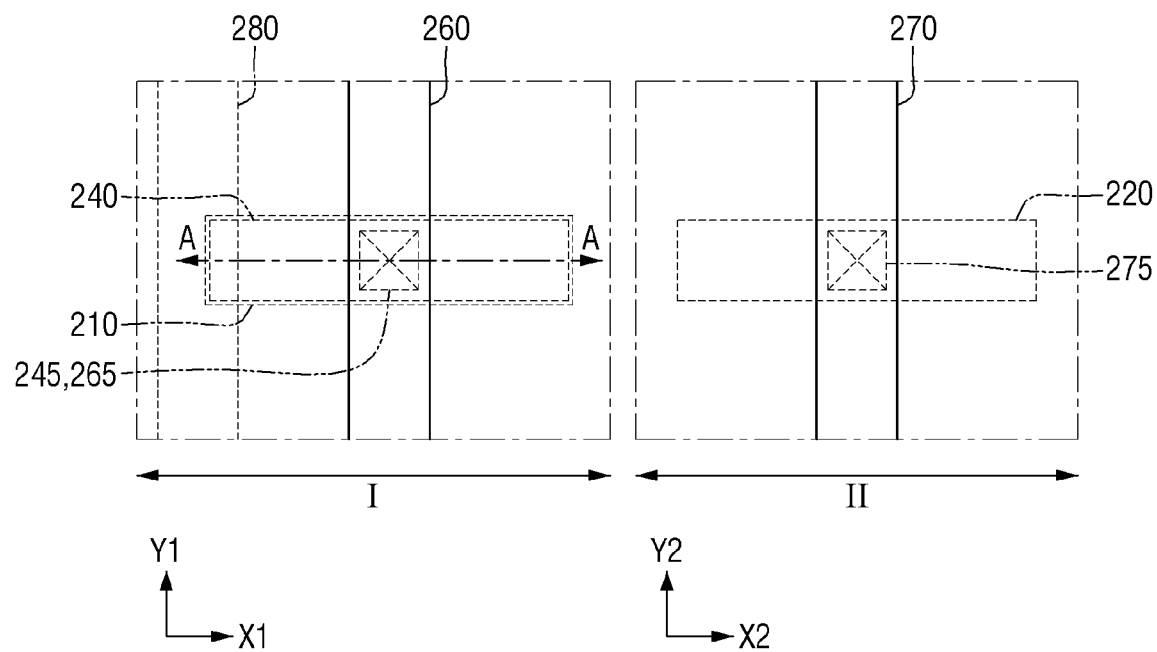
FIG. 10 is a plan view for explaining the semiconductor device according to some embodiments of the present disclosure.
Figure 11:
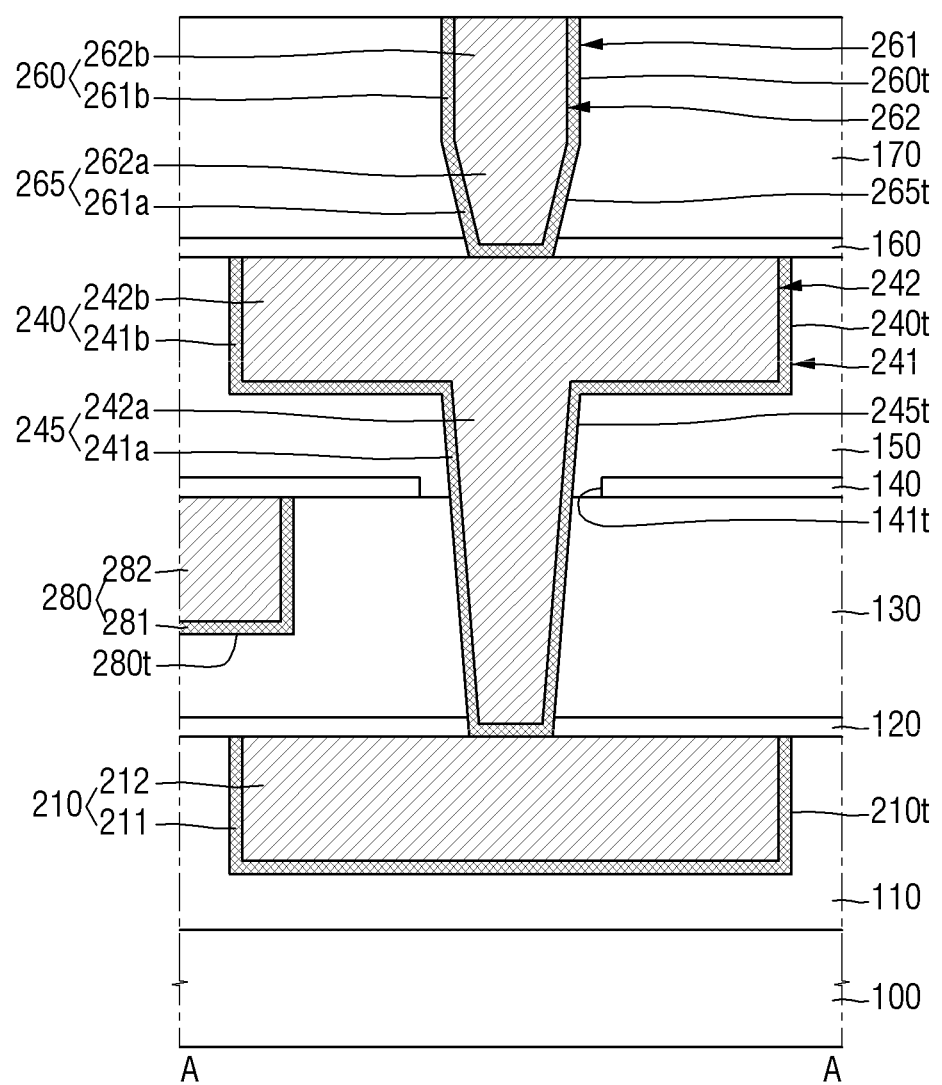
FIG. 11 is a cross-sectional view taken along line A-A of FIG. 10.

FIG. 10 is a plan view for explaining the semiconductor device according to some embodiments of the present disclosure. FIG. 11 is a cross-sectional view taken along the line A-A of FIG. 10. For the sake of convenience of explanation, differences from those described with reference to FIG. 6 to FIG. 8 will be mainly described.

For reference, FIG. 10 is an example plan view illustrated to explain the present disclosure, but embodiments are not limited thereto.

Referring to FIG. 10 and FIG. 11, in the semiconductor device according to some embodiments of the present disclosure, the second via 245 may directly connect the second wiring 240 and the first lower wiring 210.

At the second metal level, there may be no wiring connected to the second via 245. However, the sixth wiring 280 not directly connected to the second via 245 may be disposed at the second metal level. The sixth wiring 280 may be disposed in the sixth wiring trench 280t included in the second interlayer insulating layer 130. The sixth wiring 280 may include a sixth barrier layer 281, and a sixth filling layer 282 on the sixth barrier layer 281.

The second via 245 may directly connect the second wiring 240 and the first lower wiring 210 without passing through the wiring disposed at the second metal level. The second wiring 240 may be electrically connected to the first lower wiring 210 through the second via 245.

The second via 245 may be disposed in the second interlayer insulating layer 130 and the third interlayer insulating layer 150. The second via 245 may extend over the second interlayer insulating layer 130 and the third interlayer insulating layer 150.

The second etching prevention layer 140 may include a third opening 141t through which the second via 245 penetrates. For example, the second via 245 may not be in contact with the second etching prevention layer 140.

The second via trench 245t may be formed in the second interlayer insulating layer 130 and the third interlayer insulating layer 150. In other words, the second interlayer insulating layer 130 and the third interlayer insulating layer 150 may include a second via trench 245t.

The second via trench 245t may expose a part of the first lower wiring 210. The second via trench 245t may be formed in the second interlayer insulating layer 130 and the third interlayer insulating layer 150 through the third opening 141t.

At least a part of the second barrier layer 241 and at least a part of the second filling layer 242 may be disposed inside the second interlayer insulating layer 130 and the third interlayer insulating layer 150. The first portion 241a of the second barrier layer may be formed over the second interlayer insulating layer 130 and the third interlayer insulating layer 150. The first portion 242a of the second filling layer may extend over the second interlayer insulating layer 130 and the third interlayer insulating layer 150. The first portion 242a of the second filling layer may penetrate and pass through the third opening 141t.

Figure 12:
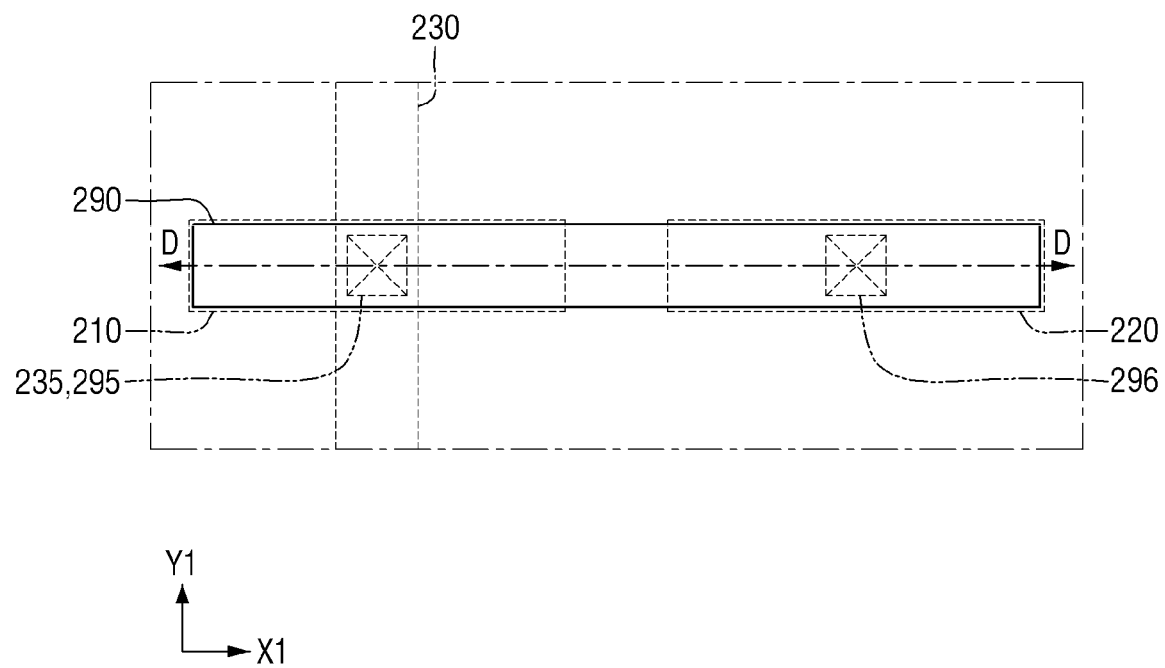
FIG. 12 is a plan view illustrating the semiconductor device according to some embodiments of the present disclosure.
Figure 13:
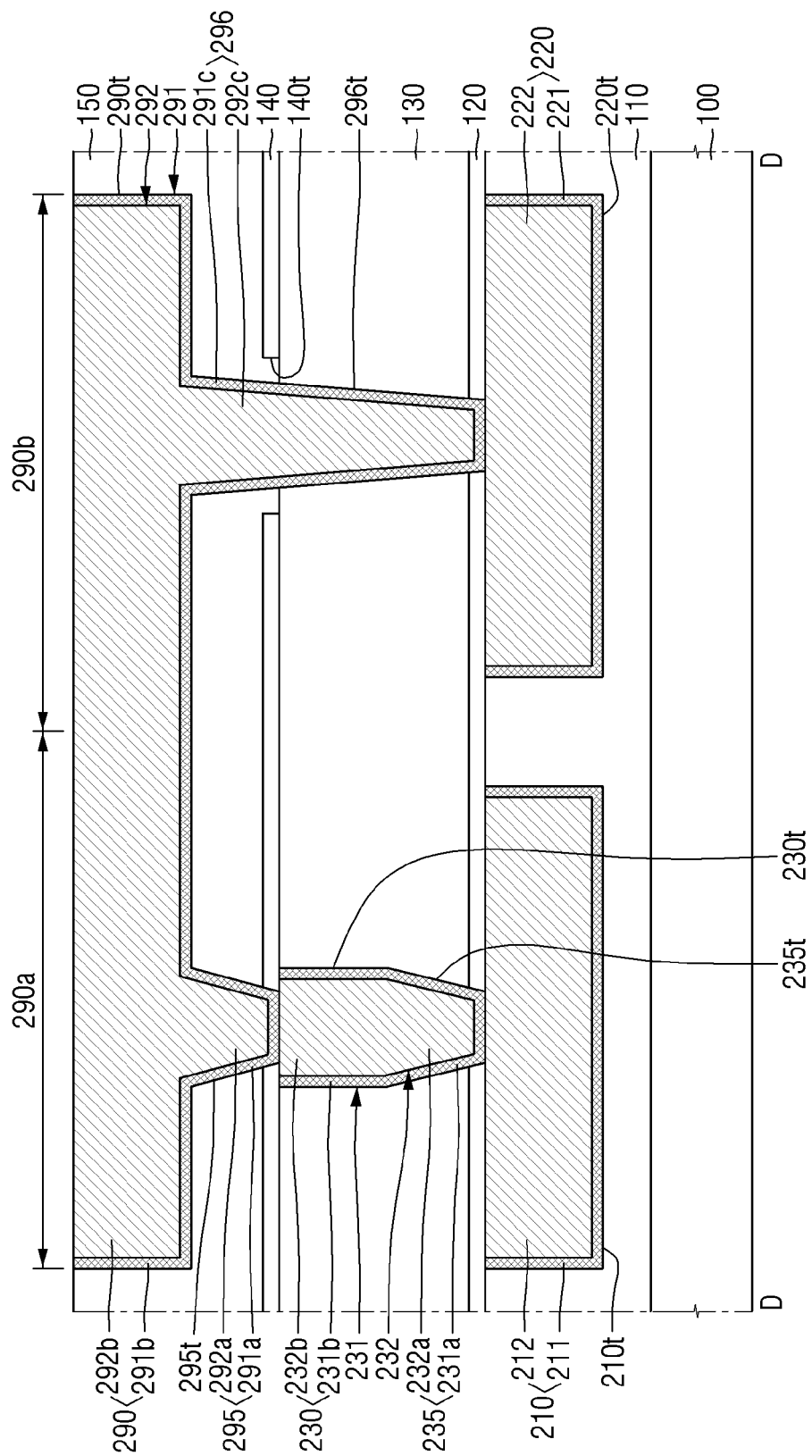
FIG. 13 is a cross-sectional view taken along line D-D of FIG. 12.

FIG. 12 is a plan view illustrating the semiconductor device according to some embodiments of the present disclosure. FIG. 13 is a cross-sectional view taken along line D-D of FIG. 12. For the sake of convenience of explanation, differences from those described with reference to FIG. 1 to FIG. 4 will be mainly described.

For reference, FIG. 12 is an example plan view illustrated to explain the present disclosure, but embodiments are not limited thereto.

Referring to FIG. 12 and FIG. 13, in the semiconductor device according to some embodiments of the present disclosure, a seventh wiring 290 connected to the first wiring 230 and the second lower wiring 220 may be disposed at the third metal level. The seventh wiring 290 may be connected to the first wiring 230 and the second lower wiring 220 by the sixth via 295 and the seventh via 296.

Although the second lower wiring 220 is illustrated as extending in the same first direction X1 as the first lower wiring 210, the present disclosure is not limited thereto.

The seventh wiring 290 may be disposed on the first wiring 230. The seventh wiring 290 may extend in the first direction X1. The seventh wiring 290 is illustrated as having a rod shape extending in the first direction X1, but embodiments are not limited thereto. That is, the seventh wiring 290 may be made up of a combination of a portion extending in the first direction X1 and a portion extending in the third direction Y1.

The seventh wiring 290 disposed at the third metal level may be connected to the first wiring 230 disposed at the second metal level and the second lower wiring 220 disposed at the first metal level at the same time. The seventh wiring 290 may be electrically connected to the first wiring 230 and the second lower wiring 220.

The sixth via 295 may directly connect the seventh wiring 290 and the first wiring 230. The seventh via 296 may directly connect the seventh wiring 290 and the second lower wiring 220. The seventh via 296 may directly connect the seventh wiring 290 and the second lower wiring 220 without passing through the wiring disposed at the second metal level.

The seventh wiring 290 may include a first portion 290a directly connected to the sixth via 295, and a second portion 290b directly connected to the seventh via 296.

The seventh wiring 290 and the sixth via 295 may be disposed in the third interlayer insulating layer 150. The seventh via 296 may be disposed in the second interlayer insulating layer 130 and the third interlayer insulating layer 150. The seventh via 296 may extend over the second interlayer insulating layer 130 and the third interlayer insulating layer 150.

The seventh via 296 may penetrate and pass through the first opening 140t. For example, the seventh via 296 may not be in contact with the second etching prevention layer 140.

The third interlayer insulating layer 150 may include a seventh wiring trench 290t and a sixth via trench 295t. The seventh wiring trench 290t may extend long in the first direction X1. The sixth via trench 295t may be formed on the bottom surface of the seventh wiring trench 290t. The sixth via trench 295t may expose a part of the first wiring 230.

Further, the third interlayer insulating layer 150 may include a seventh via trench 296t. The seventh via trench 296t may also be formed in the second interlayer insulating layer 130. In other ways, the second interlayer insulating layer 130 and the third interlayer insulating layer 150 may include a seventh via trench 296t.

The seventh via trench 296t may be formed on the bottom surface of the seventh wiring trench 290t. The seventh via trench 296t may expose a part of the second lower wiring 220. The seventh via trench 296t may be formed in the second interlayer insulating layer 130 and the third interlayer insulating layer 150 through the first opening 140t.

The seventh wiring 290 may be disposed in the seventh wiring trench 290t. The sixth via 295 may be disposed in the sixth via trench 295t. The seventh via 296 may be disposed in the seventh via trench 296t. The seventh wiring 290, the sixth via 295 and the seventh via 296 may be an integral structure.

The seventh wiring 290, the sixth via 295, and the seventh via 296 may include a seventh barrier layer 291 and a seventh filling layer 292. At least a part of the seventh barrier layer 291 and at least a part of the seventh filling layer 292 may be disposed in the second interlayer insulating layer 130 and the third interlayer insulating layer 150.

The seventh barrier layer 291 may extend along the sidewall and the bottom surface of the seventh wiring trench 290t, the sidewall and the bottom surface of the sixth via trench 295t, and the sidewall and the bottom surface of the seventh via trench 296t. The seventh filling layer 292 may be formed on the seventh barrier layer 291. The seventh filling layer 292 may fill the seventh wiring trench 290t, the sixth via trench 295t and the seventh via trench 296t.

The seventh barrier layer 291 may include a first portion 291a, a second portion 291b, and a third portion 291c. The first portion 291a of the seventh barrier layer may extend along the sidewall and the bottom surface of the sixth via trench 295t. The second portion 291b of the seventh barrier layer may extend along the sidewall and the bottom surface of the seventh wiring trench 290t. The third portion 291c of the seventh barrier layer may extend along the sidewall and the bottom surface of the seventh via trench 296t.

The seventh filling layer 292 may include a first portion 292a, a second portion 292b, and a third portion 292c. The first portion 292a of the seventh filling layer may fill the sixth via trench 295t. The second portion 292b of the seventh filling layer may fill the seventh wiring trench 290t. The third portion 292c of the seventh filling layer may fill the seventh via trench 296t.

The third portion 292c of the seventh filling layer may extend over the second interlayer insulating layer 130 and the third interlayer insulating layer 150. The third portion 292c of the seventh filling layer may penetrate and pass through the first opening 140t.

The seventh wiring 290 may include the second portion 291b of the seventh barrier layer and the second portion 292b of the seventh filling layer. The sixth via 295 may include the first portion 291a of the seventh barrier layer and the first portion 292a of the seventh filling layer. The seventh via 296 may include the third portion 291c of the seventh barrier layer and the third portion 292c of the seventh filling layer.

The first portion 292a of the seventh filling layer may connect the first wiring 230 and the seventh wiring 290. The first portion 292a of the seventh filling layer may connect the first filling layer 232 and the second portion 292b of the seventh filling layer.

The third portion 292c of the seventh filling layer may connect the second lower wiring 220 and the seventh wiring 290. The third portion 292c of the seventh filling layer may connect the second lower filling layer 222 and the second portion 292b of the seventh filling layer.

The seventh filling layer 292 may be spaced apart from the first filling layer 232. A seventh barrier layer 291 may be disposed between the seventh filling layer 292 and the first filling layer 232. In other ways, the first portion 292a of the seventh filling layer and the second portion 232b of the first filling layer may be spaced apart from each other, by the first portion 291a of the seventh barrier layer extending between the first portion 292a of the seventh filling layer and the third interlayer insulating layer 150, and between the first portion 292a of the seventh filling layer and the second portion 232b of the first filling layer.

FIG. 14 to FIG. 20 are intermediate step diagrams for explaining a method for manufacturing a semiconductor device according to some embodiments of the present disclosure.

For reference, FIG. 14 to FIG. 20 are diagrams illustrating the first region I and the second region II of FIG. 1.

Figure 14:
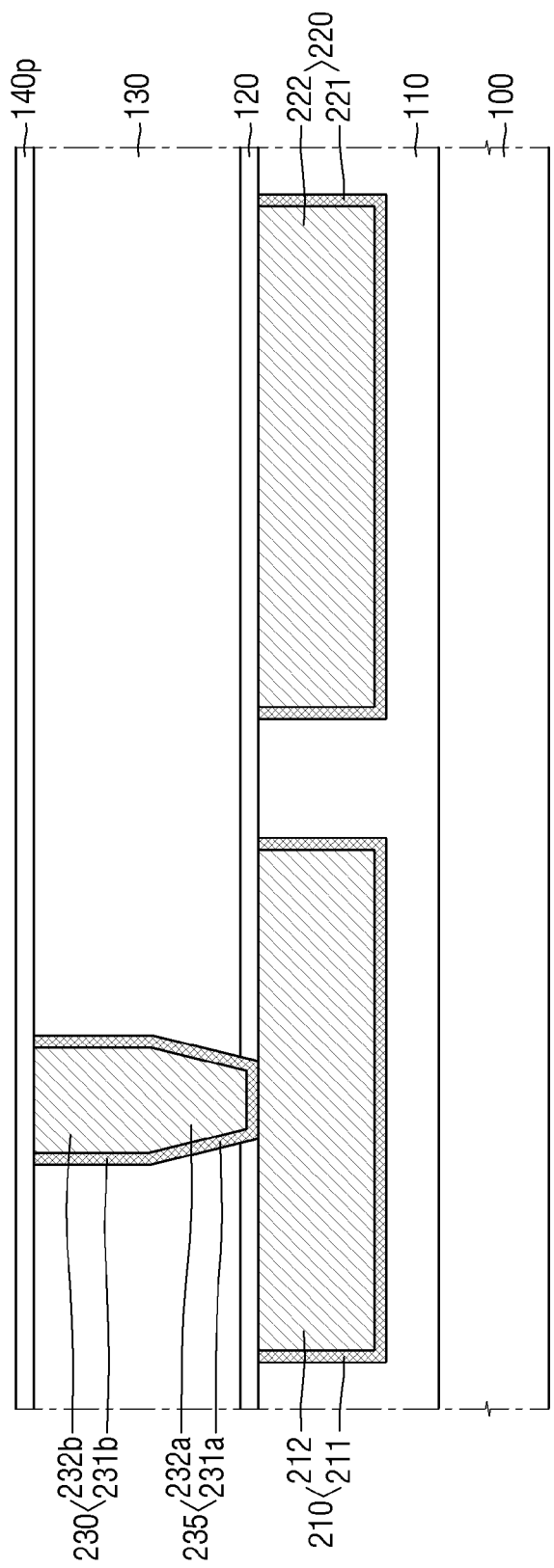
FIG. 14 to FIG. 20 are intermediate step diagrams for explaining a method for manufacturing a semiconductor device according to some embodiments of the present disclosure.

Referring to FIG. 14, the first lower wiring 210 and the second lower wiring 220 may be formed in the first interlayer insulating layer 110 on the substrate 100.

The first etching prevention layer 120 and the second interlayer insulating layer 130 may be sequentially formed on the first lower wiring 210 and the second lower wiring 220.

The first wiring 230 and the first via 235 may be formed in the second interlayer insulating layer 130. The first via 235 may directly connect the first wiring 230 and the first lower wiring 210.

A free etching prevention layer 140p may be formed on the second interlayer insulating layer 130 on which the first wiring 230 is formed.

Figure 15:
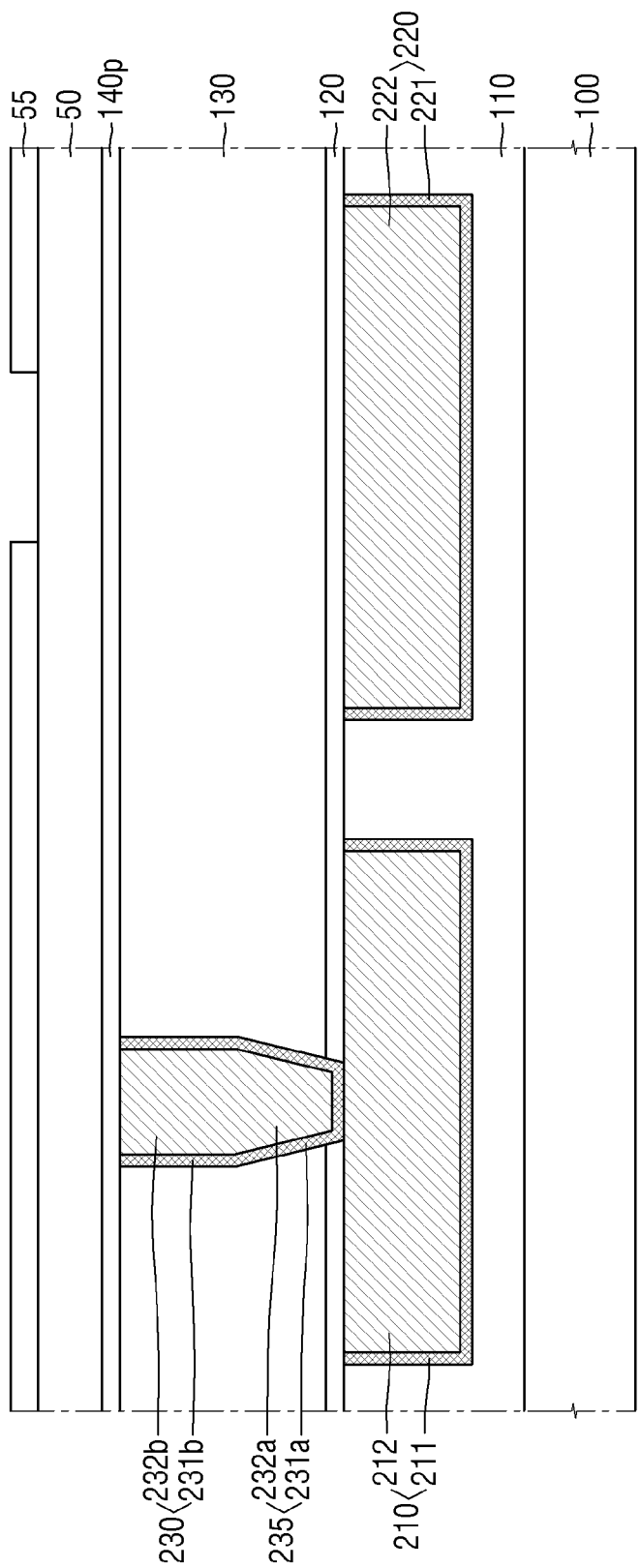

Referring to FIG. 15, the first mask layer 50 may be formed on the free etching prevention layer 140p.

A first photosensitive film pattern 55 for exposing a part of the first mask layer 50 may be formed on the first mask layer 50.

Figure 16:
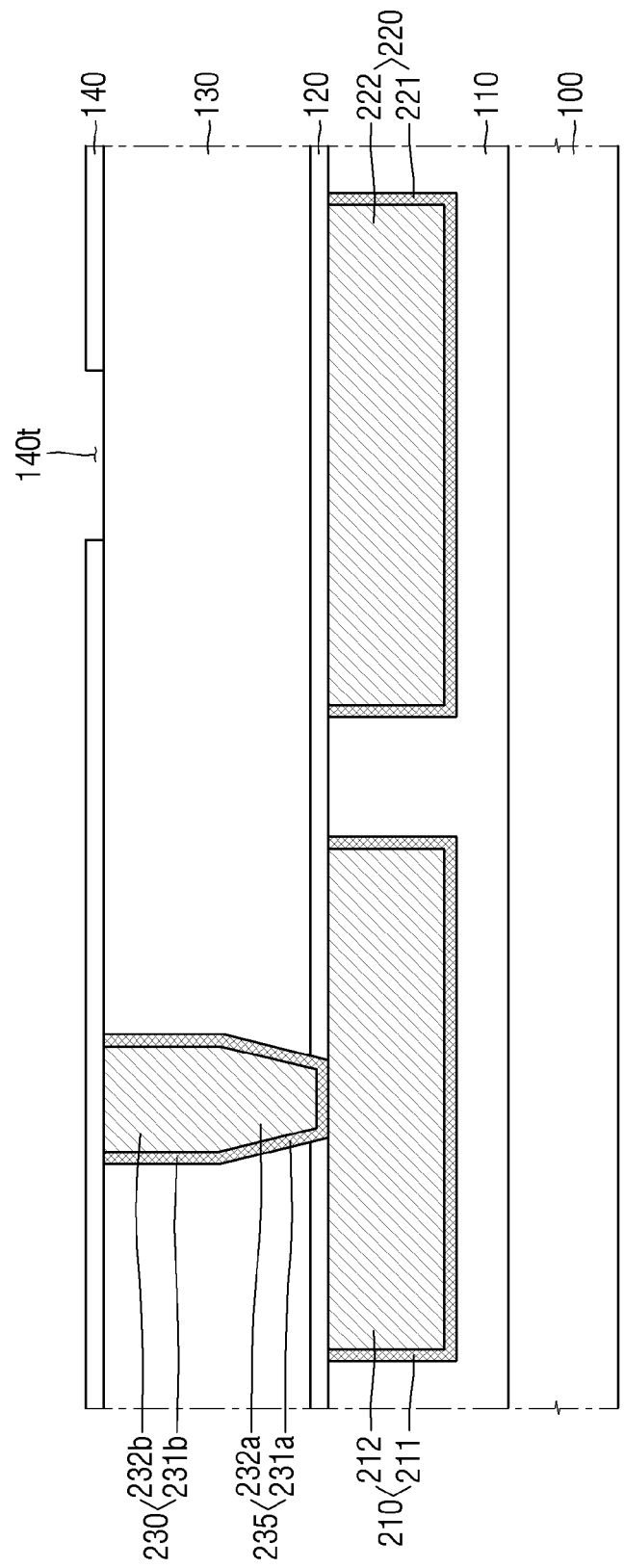

Referring to FIG. 15 and FIG. 16, the first mask layer 50 may be patterned, using the first photosensitive film pattern 55.

The first opening 140t may be formed in the free etching prevention layer 140p, using the patterned first mask layer 50.

That is, the second etching prevention layer 140 including the first opening 140t may be formed on the first wiring 230.

Figure 17:
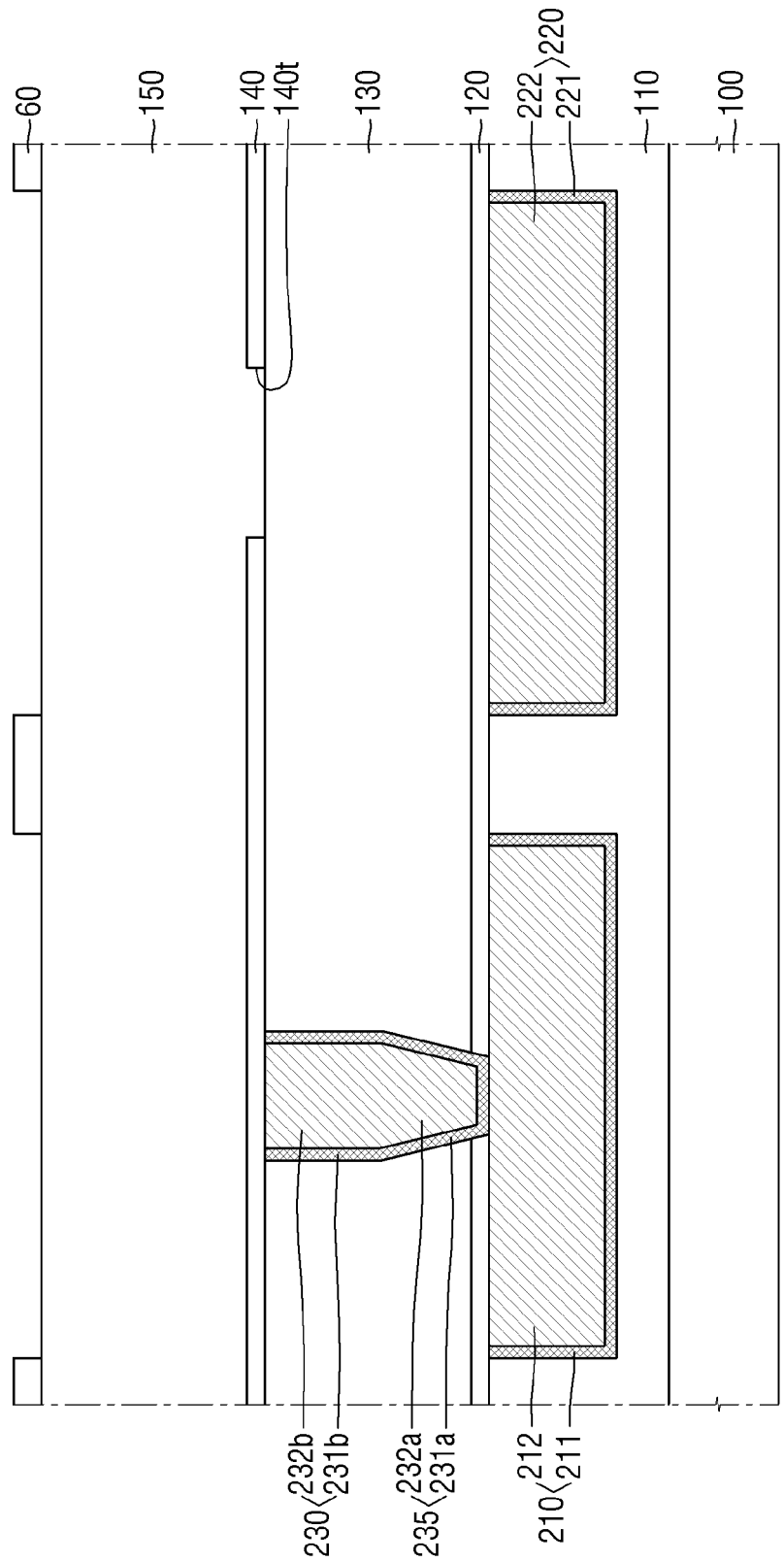

Referring to FIG. 17, the third interlayer insulating layer 150 may be formed on the second etching prevention layer 140.

A hard mask pattern 60 which exposes a part of the third interlayer insulating layer 150 may be formed on the third interlayer insulating layer 150.

Figure 18:
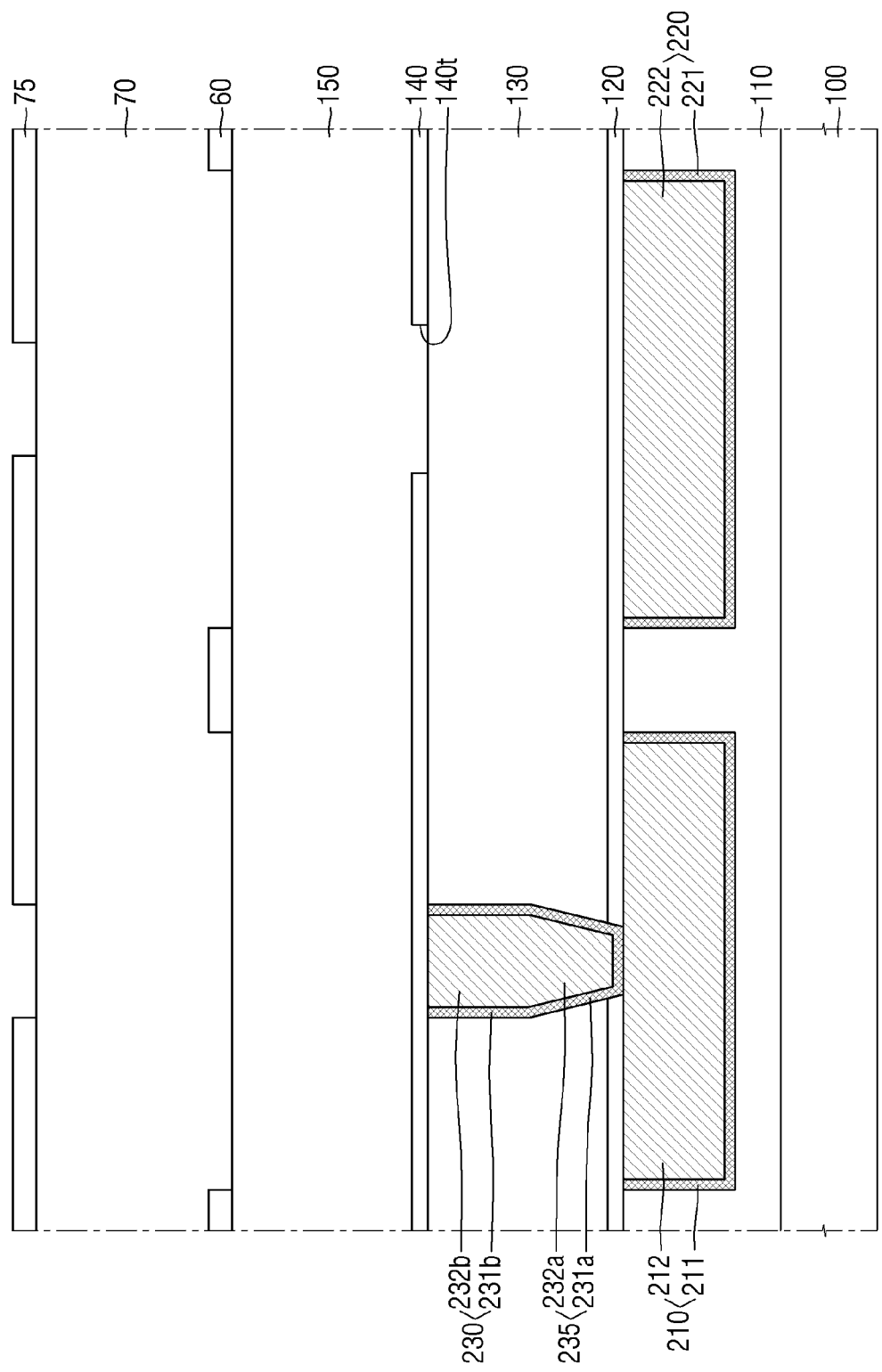

Referring to FIG. 18, a second mask layer 70 may be formed on the third interlayer insulating layer 150 and the hard mask pattern 60.

A second photosensitive film pattern 75 which exposes a part of the second mask layer 70 may be formed on the second mask layer 70.

Figure 19:
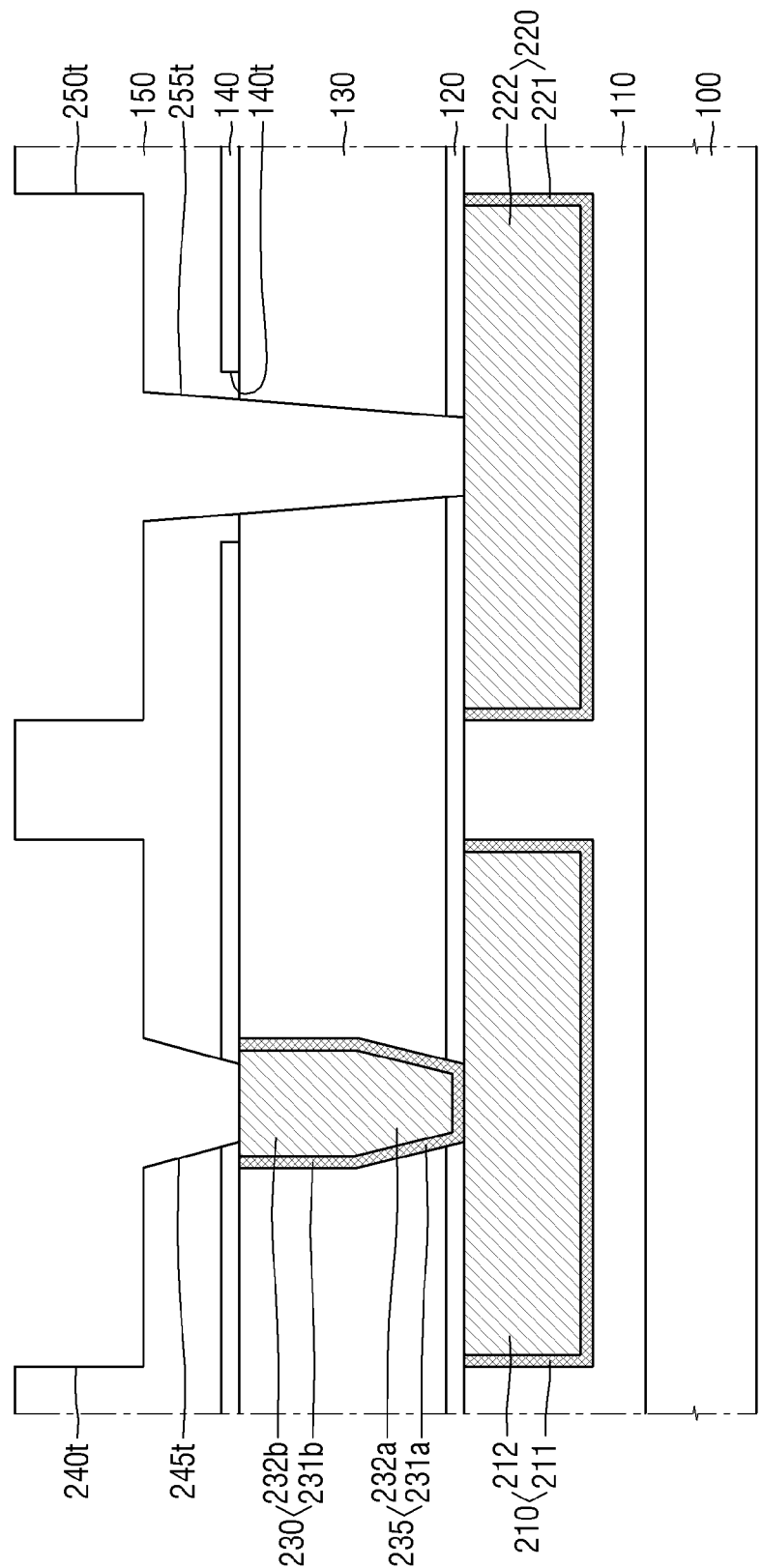

Referring to FIG. 18 and FIG. 19, the second wiring trench 240t, the second via trench 245t, the third wiring trench 250t, and the third via trench 255t may be formed in the third interlayer insulating layer 150, using the second photosensitive film pattern 75 and the second mask layer 70. The third via trench 255t may extend into the second interlayer insulating layer 130.

The second via trench 245t may expose a part of the first wiring 230. The third via trench 255t may penetrate through the first opening 140t. The third via trench 255t may expose a part of the second lower wiring 220.

Figure 20:
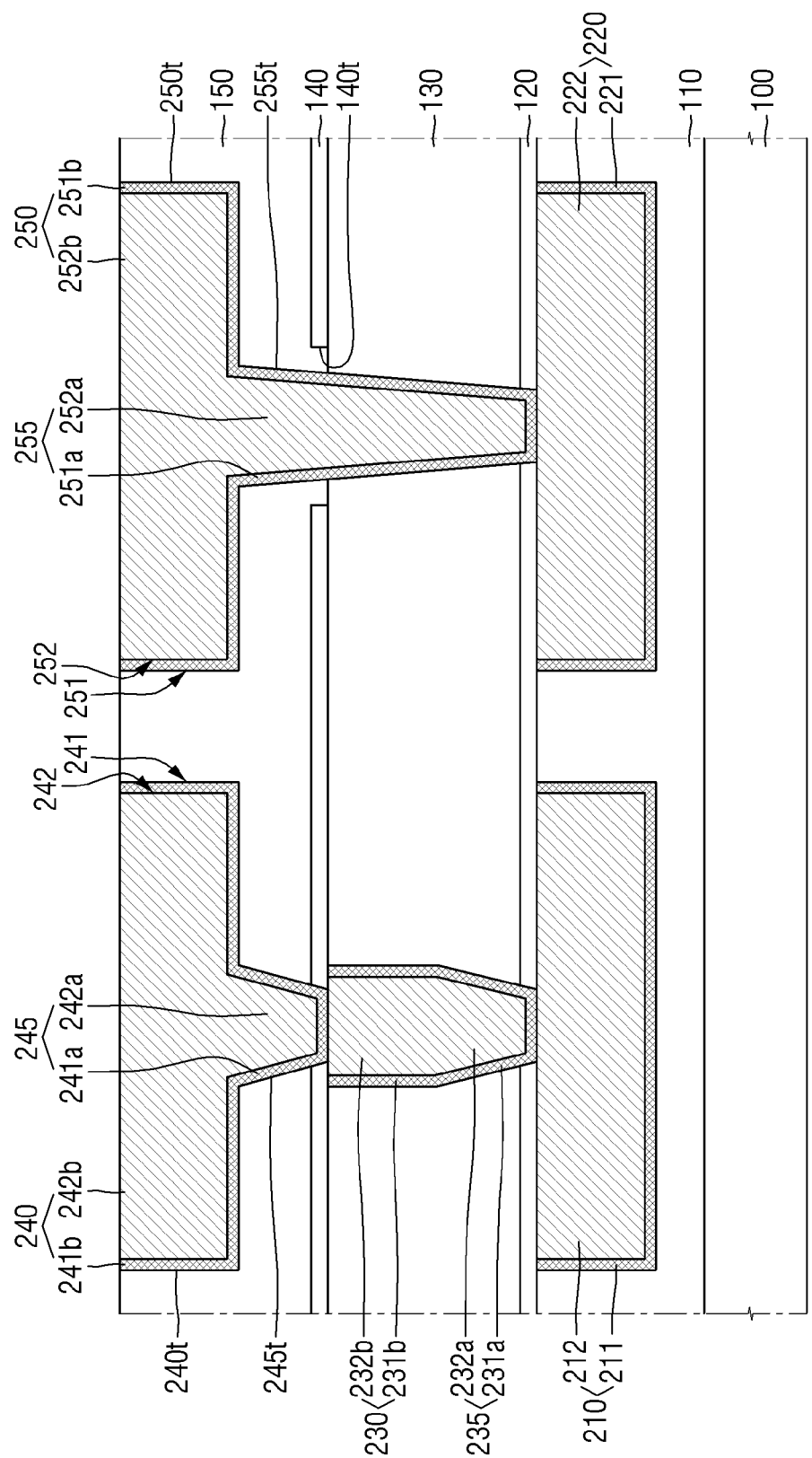

Referring to FIG. 20, the second barrier layer 241 may be formed along the sidewall and the bottom surface of the second wiring trench 240t and the sidewall and the bottom surface of the second via trench 245t. A second filling layer 242 for filling the second wiring trench 240t and the second via trench 245t may be formed on the second barrier layer 241.

Further, a third barrier layer 251 may be formed along the sidewall and the bottom surface of the third wiring trench 250t and the sidewall and the bottom surface of the third via trench 255t. A third filling layer 252 for filling the third wiring trench 250t and the third via trench 255t may be formed on the third barrier layer 251.

As a result, the second wiring 240, the third wiring 250 and the second via 245 may be formed in the third interlayer insulating layer 150. Further, a third via 255 may be formed in the second interlayer insulating layer 130 and the third interlayer insulating layer 150.

In concluding the detailed description, those skilled in the art will appreciate that many variations and modifications may be made to the example embodiments without substantially departing from the principles of the present disclosure. Therefore, the disclosed example embodiments of the present disclosure are used in a generic and descriptive sense only and not for purposes of limitation.

What is claimed is:

1. A semiconductor device comprising:
a first wiring and a second wiring at a first metal level;
a third wiring and a fourth wiring at a second metal level different from the first metal level;
a first via which directly connects the first wiring and the third wiring, the first via being integral with the third wiring, the first via being tapered and having a maximum width that is less than a width of the third wiring;
a fifth wiring at a third metal level between the first metal level and the second metal level and connected to the second wiring;
a second via which directly connects the fourth wiring and the fifth wiring;
an etching prevention layer between the first metal level and the second metal level, not on the first wiring and includes an opening, the first via extending through the opening, and
an interlayer insulating layer having portions above the first via,
wherein a width of a bottom portion of the third wiring is greater than a width of a topmost portion of the first via.

2. The semiconductor device of claim 1, wherein the first via is not in contact with the etching prevention layer.

3. The semiconductor device of claim 1, further comprising:
an etching prevention layer between the first metal level and the second metal level,
wherein the first via penetrates the etching prevention layer and is in contact with the etching prevention layer.

4. The semiconductor device of claim 1, further comprising:
a third via which directly connects the second wiring and the fifth wiring.

5. The semiconductor device of claim 4, further comprising:
a sixth wiring at a fourth metal level between the first metal level and the third metal level; and
an etching prevention layer between the first metal level and the third metal level and including an opening,
wherein the third via passes through the opening.

6. The semiconductor device of claim 5, wherein the third via is not in contact with the etching prevention layer.

7. The semiconductor device of claim 1, further comprising:
a sixth wiring in a fourth metal level between the first metal level and the third metal level;
a third via which directly connects the fifth wiring and the sixth wiring; and
a fourth via which directly connects the fifth wiring and the second wiring.

8. The semiconductor device of claim 7, further comprising:
a first etching prevention layer between the first metal level and the third metal level and including a first opening; and
a second etching prevention layer between the second metal level and the fourth metal level and including a second opening,
wherein the first via passes through the first opening and the second opening.

9. The semiconductor device of claim 8, wherein the first via is not in contact with the first etching prevention layer and the second etching prevention layer.

10. The semiconductor device of claim 1, wherein the third wiring and the fourth wiring are directly connected to each other.

11. A semiconductor device comprising:
a first wiring and a second wiring at a first metal level;
a third wiring and a fourth wiring at a second metal level higher than the first metal level;
a first interlayer insulating layer between the first metal level and the second metal level and above the first wiring and second wiring, a second interlayer insulating layer on the first interlayer insulating layer;
a first filling layer which connects the first wiring and the third wiring, and extending through the first interlayer insulating layer and the second interlayer insulating layer, the first filling layer being tapered and having a maximum width that is less than a width of the third wiring, the second interlayer insulating layer having portions above the first via;
a second filling layer in the first interlayer insulating layer and connected to the second wiring; and
a third filling layer in the second interlayer insulating layer and connected to the fourth wiring and the second filling layer, the third filling layer is at the second metal level,
wherein a width of a bottom portion of the third wiring is greater than a width of a topmost portion of the first filling layer.

12. The semiconductor device of claim 11, wherein the third filling layer is spaced apart from the second filling layer.

13. The semiconductor device of claim 11, further comprising:
a barrier layer between the second filling layer and the third filling layer,
wherein the barrier layer extends between the third filling layer and the second interlayer insulating layer.

14. The semiconductor device of claim 11, further comprising:
an etching prevention layer between the first interlayer insulating layer and the second interlayer insulating layer,
wherein the first filling layer penetrates through the etching prevention layer.

15. The semiconductor device of claim 14, wherein the etching prevention layer includes an opening, and
the first filling layer passes through the opening.

16. The semiconductor device of claim 11, further comprising:
a fifth wiring at a third metal level between the first metal level and the second metal level,
wherein the fifth wiring including a part of the second filling layer.

17. A semiconductor device comprising:
a first wiring and a second wiring;
a first interlayer insulating layer on the first wiring and the second wiring;
a third wiring in the first interlayer insulating layer;
an etching prevention layer including an opening on the third wiring;
a second interlayer insulating layer on the etching prevention layer;
a fourth wiring and a fifth wiring in the second interlayer insulating layer;
a first trench which exposes a part of the first wiring in the first interlayer insulating layer;
a second trench which exposes a part of the third wiring in the second interlayer insulating layer;
a third trench which penetrates the opening and exposes a part of the second wiring, in the first interlayer insulating layer and the second interlayer insulating layer;
a first via which connects the first wiring and the third wiring in the first trench, the first via being integral with the third wiring, the first via being tapered and having a maximum width that is less than a width of the third wiring, the second interlayer insulating layer having portions above the first via;
a second via which connects the third wiring and the fourth wiring in the second trench; and
a third via which connects the second wiring and the fifth wiring in the third trench,
wherein a width of a bottom portion of the third wiring is greater than a width of a topmost portion of the first via.

18. The semiconductor device of claim 17, wherein the third via is not in contact with the etching prevention layer.

19. The semiconductor device of claim 17, wherein the fourth wiring and the fifth wiring are directly connected to each other.

* * * * *